United States Patent
Kitahara

(10) Patent No.: US 6,502,228 B1
(45) Date of Patent: Dec. 31, 2002

(54) ROUTE DETERMINATION SUPPORT DEVICE, ROUTE DETERMINATION SUPPORT METHOD AND STORAGE MEDIUM STORING THEREIN PROGRAM FOR EXECUTING METHOD THEREOF, AND PRINTED SUBSTRATE WIRING METHOD

(75) Inventor: Masafumi Kitahara, Tokyo (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 224 days.

(21) Appl. No.: 09/594,086

(22) Filed: Jun. 15, 2000

(30) Foreign Application Priority Data

Jun. 16, 1999 (JP) ............................................ 11-169182

(51) Int. Cl.$^7$ ............................................. G06F 17/50
(52) U.S. Cl. .............................. 716/12; 716/13; 716/14
(58) Field of Search ..................................... 716/12–15

(56) References Cited

U.S. PATENT DOCUMENTS

| | | | | |
|---|---|---|---|---|
| 5,229,941 A | * | 7/1993 | Hattori | .................. 364/424.02 |
| 5,889,677 A | * | 3/1999 | Yasuda et al. | ............... 364/488 |
| 5,926,397 A | * | 7/1999 | Yamanouchi | ................ 364/491 |
| 6,240,541 B1 | * | 5/2001 | Yasuda et al. | ................. 716/6 |

FOREIGN PATENT DOCUMENTS

| | | |
|---|---|---|
| JP | 63-272094 | 11/1988 |
| JP | 2-150970 | 6/1990 |
| JP | 4-257976 | 9/1992 |
| JP | 5-242202 | 9/1993 |
| JP | 6-162143 | 6/1994 |
| JP | 6-309414 | 11/1994 |
| JP | 7-296019 | 11/1995 |

OTHER PUBLICATIONS

Cong et al, "Minimum–Cost Bounded–Skew Clock Routing," IEEE, May 1995, pp. 215–218.*
Cobb et al, "Balanced Routing," IEEE, Oct. 1997, pp. 277–284.*

* cited by examiner

*Primary Examiner*—Vuthe Siek
(74) *Attorney, Agent, or Firm*—Sughrue Mion, PLLC

(57) ABSTRACT

A route determination support device enables target point to be navigated according to ratsnest with respect to reliable outline route, thus causing wiring to be formed approximately for the route which is intended by the operator finally. The route determination support device (ratsnest display device) consists of a singularity point position calculator for calculating the singularity point representing inputted outline route, a singularity point storage unit for storing therein the singularity point calculated by the singularity point position calculator, and a target point calculator for selecting a point with the most shortest distance from among the calculated distances as the target point, while calculating distance between the position of the stored singularity point and the present position in the inputted wiring operation.

50 Claims, 16 Drawing Sheets

FIG. 1 PRIOR ART
LARGE AREA WIRING
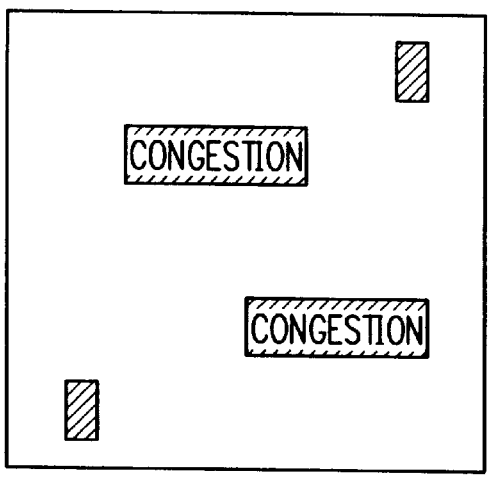
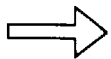
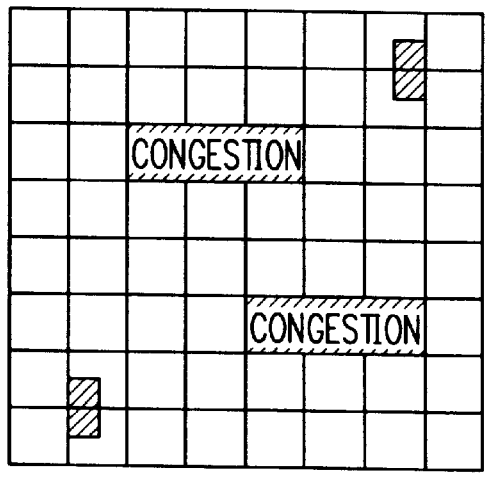
SCREEN IS DIVIDED INTO
MATRIX SHAPED FRAME
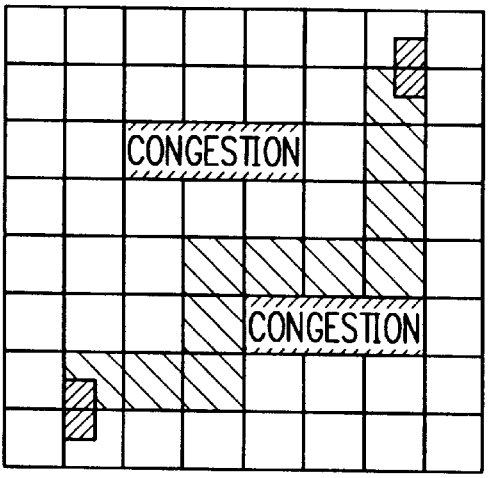
CALCULATING TO BE DISPLAYED
ROUTE AVOIDING CONGESTION

OPERATION SCREEN

FIG. 5
OUTLINE WIRING ROUTE
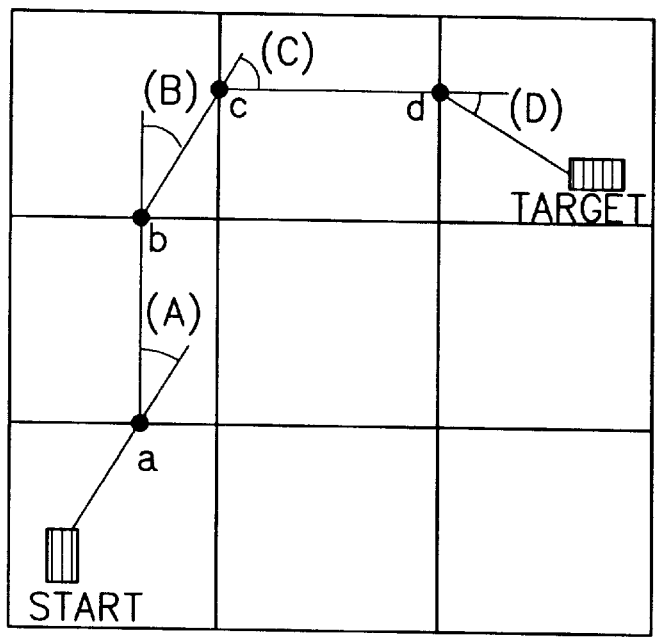
45 DEGREE AT THIS TIME (C) BECOMES SINGULARITY POINT
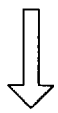
RESULT OF SINGULARITY POINT EXTRACTION
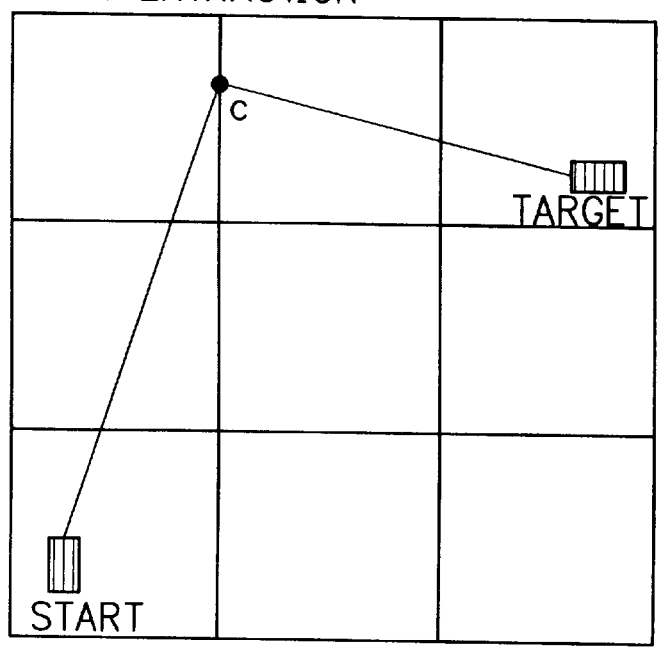

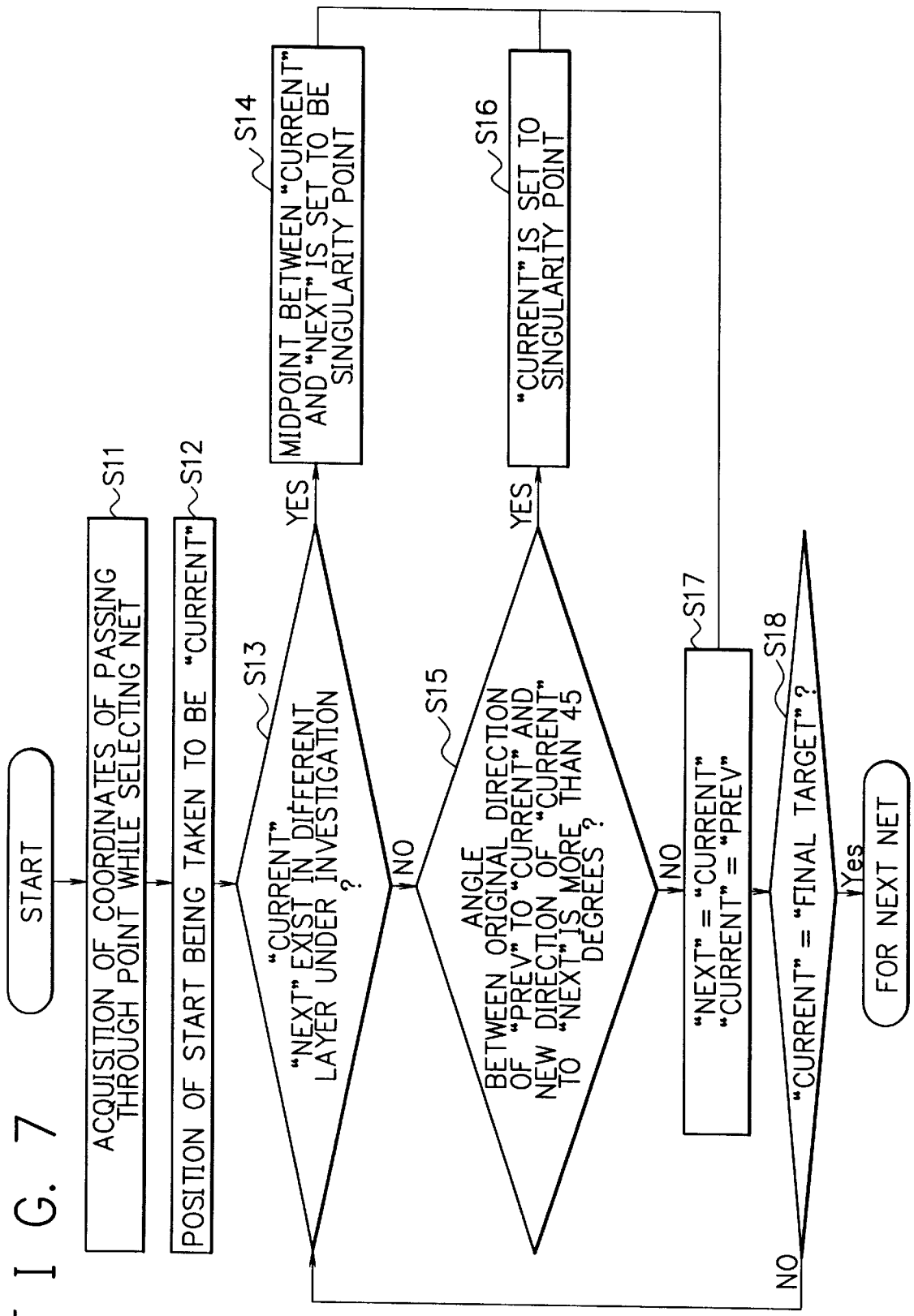

F I G. 11
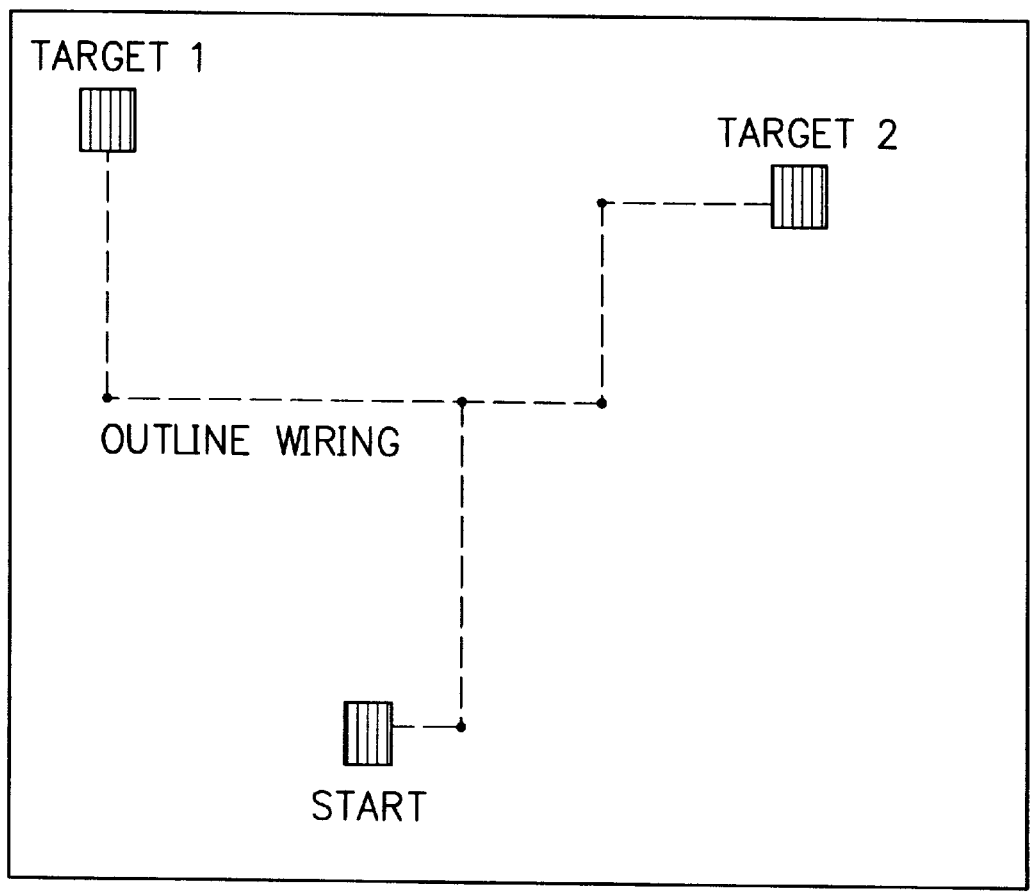

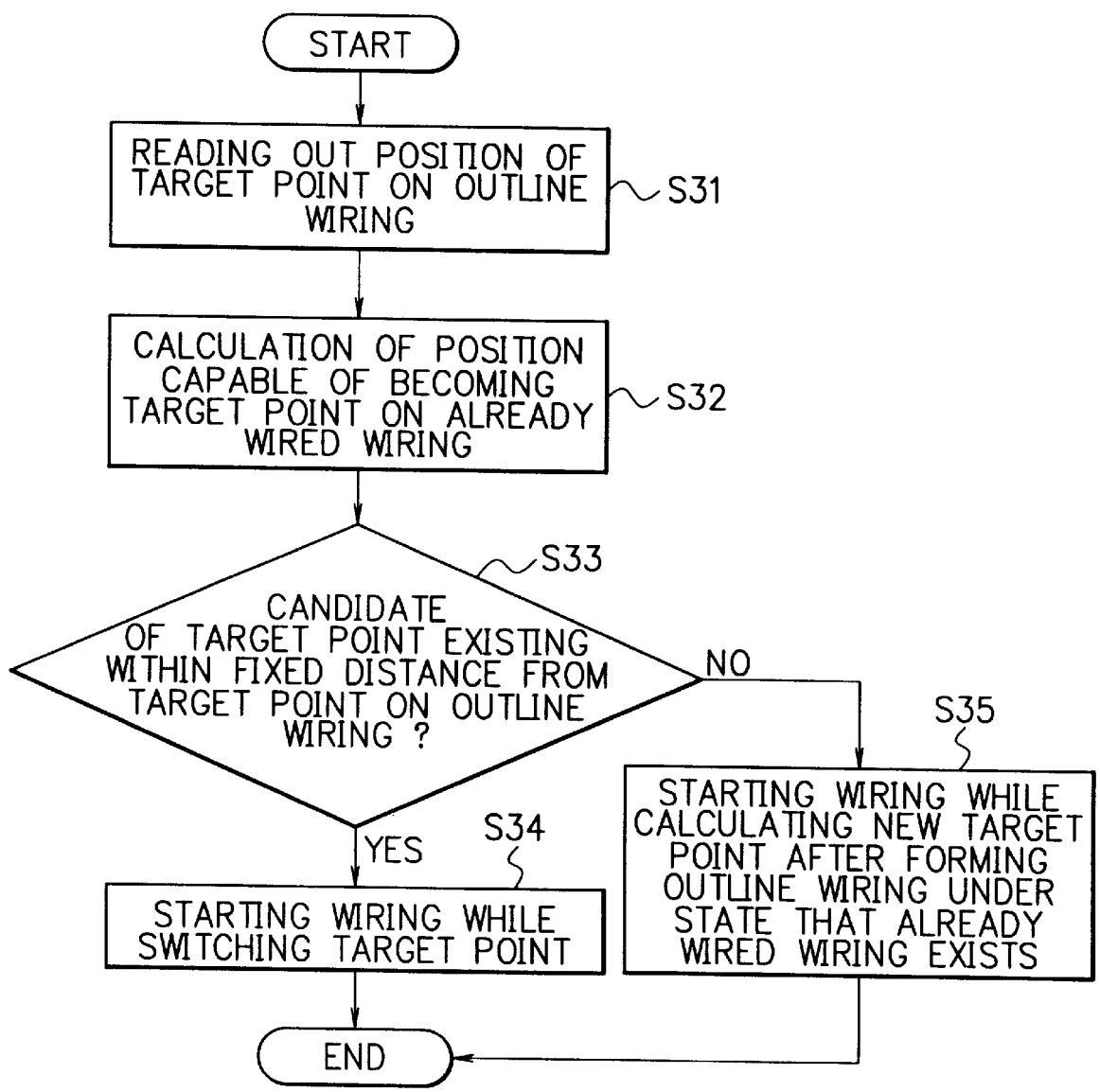

ROUTE DETERMINATION SUPPORT DEVICE, ROUTE DETERMINATION SUPPORT METHOD AND STORAGE MEDIUM STORING THEREIN PROGRAM FOR EXECUTING METHOD THEREOF, AND PRINTED SUBSTRATE WIRING METHOD

BACKGROUND OF THE INVENTION

The present invention relates to a route determination support device, a route determination supporting method and a storage medium storing therein a program for executing method thereof, and a printed substrate wiring method. More to particularly, this invention relates to a route determination support device capable of recognizing thoroughly the direction of movement from the present position of the user, and to a storage medium storing therein a program for executing supporting method of the route determination wherein the route determination support device is utilized as a wiring design supporting mean on the occasion of wiring working of a printed substrate.

DESCRIPTION OF THE PRIOR ART

Formerly, for instance, the Japanese Patent Application Laid-Open No. HEI 5-242202 discloses "Wiring Design Support Device" and the Japanese Patent Application Laid-Open No. HEI 7-296019 discloses "Wiring Route Determination System". These device and system are capable of being utilized as the wiring design supporting means on the occasion of implementation of wiring working of the printed substrate by the worker.

In the above-described prior art, there is an area on a printed substrate, where wiring has been completed. When degree of congestion of the area is high, it is necessary to perform wiring while avoiding the area. It is required to support wiring while avoiding such the area. In order to support the wiring, when the operator selects a start point of the wiring, it causes a route connecting the selected start point with the end of line of the wiring to be shown. Thus, it causes provisional outline route to be shown. Such the provisional outline route can be thought that it enables the wiring to be performed efficiently because such the outline route is calculated in consideration of state of whole printed substrate.

There is described the outline route. As shown in FIG. 1, the whole printed substrate is divided into a matrix-shaped frame shape. It causes an area of avoiding the wiring to be decided when the degree of congestion of such area is high. It is considered that efficient wiring is possible. It is considered the area with the matrix-shaped frame unit except for the above-described area with high degree of congestion. It is calculated whether or not the efficient wiring becomes possible without the congestion if the wiring passes through which position. Thus, the outline route is a global wiring route represented above described matter. One example of the outline route decided in such a way as above procedure is shown in FIG. 2.

Further, a ratsnest is always displayed. The ratsnest connects a point where the operator implements wiring operation actuary with the end point. The operator operates while moving. The operator can refer to the ratsnest on the display. The ratsnest is displayed on the display in answer to course of the operation. Thus the operator can recognize position direction of the end point by referring to the ratsnest. The operator saves his trouble of searching the end point on the display. The route for the end point is shown without time for searching the end point.

However, there is the problem that time is required in order to refer to the outline route again by the operator when the outline route is out of display screen while being turned away the practical wiring route from the out line route once. When the operator implements wiring operation practically, as shown in FIG. 3, the display screen displays the operating point while magnifying the neighborhood of the operating point so that the neighborhood of the point of the wiring operation becomes clear.

SUMMARY OF THE INVENTION

In view of the foregoing, it is an object of the present invention, in order to overcome the above-mentioned problem, to provide a route determination support device, a storage medium storing therein a program for executing a route determination supporting method, and a printed substrate wiring method while employing the route determination support device. Such route determination support device enables ratsnest to be displayed such that progressing direction of wiring is capable of being recognized by the operator although both of the start point and the end point are not shown within the screen displayed on the occasion of implementing the wiring operation of the printed substrate mainly, and enables the ratsnest which is changed dynamically to be displayed during the wiring operation. Because, in the halfway through the practical wiring operation, it is required that it causes deviation direction from the recommended outline route to be recognized visually on the display screen.

It is another object of the present invention, to provide a route determination support device, and a storage medium storing therein a program for executing a route determination supporting method. Such the route determination support device enables ratsnest to be displayed in order to be capable of recognizing progressing direction from the present position of the user. The ratsnest displayed on the display screen of the route determination support device is changed dynamically so that the direction can be recognized when guide of operating direction from the present operating point is required for the user.

According to a first aspect of the present invention, in order to achieve the above mentioned object, there is provided a route determination support device which comprises an input unit for inputting information for determining the route, a singularity point position calculator for searching position of a singularity point with direction switching property of the route, a singularity point storage unit for storing therein data of the singularity point calculated by the singularity point position calculator, a target point calculator for selecting a point with the shortest distance from among calculated distances as a target point while calculating distance between the position of the singularity point stored in the singularity point storage unit and a present position utilizing priority of wiring order determined beforehand, and an output unit for displaying ratsnest concerning progress and/or result of route determination operation.

According to a second aspect of the present invention, in the first aspect, there is provided a route determination support device, wherein target point calculator extracts at least one target point whose angle between newly progressing direction of the route and original progressing direction of the route is more than certain threshold value as the singularity point from outline route displayed on a screen of the output unit.

According to a third aspect of the present invention, in the first aspect, there is provided a route determination support device, wherein target point calculator selects a point at which progressing direction of the outline route changes into vertical direction with respect to plane of wiring route as the singularity point.

According to a fourth aspect of the present invention, in the first aspect, there is provided a route determination support device, wherein the target point calculator extracts the target point from among the singularity points on the basis of result of multiplying coefficients in accordance with given order to respective singularity points from start point side of the outline route by distance between the present point and respective singularity point in every singularity point.

According to a fifth aspect of the present invention, in the fourth aspect, wherein the coefficients is coefficient which increases in accordance with given order with respect to respective singularity points.

According to a sixth aspect of the present invention, in the fifth aspect, there is provided a route determination support device, wherein the target point calculator extracts one and/or a plurality of target point from the singularity points with small value from among the results obtained by multiplying the coefficient by distance between the present point and respective singularity points in every singularity point.

According to a seventh aspect of the present invention, in the sixth aspect, there is provided a route determination support device, wherein the given order in every respective singularity point is updated in such a way that in every time when the present point approaches within prescribed distance from the target point, it causes the singularity point positioned at the side of end point of the outline route by one to be starting point.

According to an eighth aspect of the present invention, in the first aspect, there is provided a route determination support device, which further comprises a passing through point acquisition means for acquiring the passing through point of the outline route displayed on a screen to be ideal route, a singularity point calculation means for calculating at least one singularity point on the basis of prescribed condition from among the acquired passing through points, a distance calculation means for calculating distance between the calculated singularity points and the present point whose position is movable on the screen, a multiplying means for multiplying the coefficient in accordance with order which is given to respective singularity points from the starting point side of the outline route on the outline route by the distance calculated by the distance calculation means, a target point established means for calculating at least one target point from among the singularity point on the basis of the result of the multiplication, and a display means for displaying a straight line for connecting at least one target point established previously with the present point.

According to a ninth aspect of the present invention, in the first aspect, there is provided a route determination support device, which further comprises a passing through point acquisition means for acquiring the passing through point on matrix-shaped frame dividing the whole printed wiring substrate according to displayed outline route on the screen to be ideal route, a singularity point calculation means for calculating at least one singularity point on the basis of prescribed condition from among the acquired passing through points, a distance calculation means for calculating distance between the calculated singularity point and an operation point to be a pointed end place of a wiring operation, a multiplying means for multiplying the coefficient in accordance with order which is given to respective singularity points from the starting point side of the outline route on the outline route by the distance calculated by the distance calculation means, a target point established means for calculating at least one target point from among the singularity point on the basis of the result of the multiplication, and a display means for displaying a straight line for connecting at least one target point established previously with the present point.

According to a tenth aspect of the present invention, in the eighth aspect, there is provided a route determination support device, wherein singularity point calculation means extracts at least one target point whose angle between newly progressing direction of the route and original progressing direction of the route is more than certain threshold value as the singularity point from outline route displayed on a screen of the output unit.

According to an eleventh aspect of the present invention, in the eighth aspect, there is provided a route determination support device, wherein singularity point calculation means selects a point at which progressing direction of the outline route changes into vertical direction with respect to plane of wiring route as the singularity point.

According to a twelfth aspect of the present invention, in the eighth aspect, there is provided a route determination support device, wherein the target point calculation means extracts the target point from among the singularity points on the basis of result of multiplying coefficients in accordance with given order to respective singularity points from start point side of the outline route by distance between the present point and respective singularity point in every singularity point.

According to a thirteenth aspect of the present invention, in the twelfth aspect, there is provided a route determination support device, wherein said coefficients is coefficient which increases in accordance with given order with respect to respective singularity points.

According to a fourteenth aspect of the present invention, in the thirteenth aspect, there is provided a route determination support device, wherein the singularity point calculation means extracts one and/or a plurality of target point from the singularity points with small value from among the results obtained by multiplying said coefficient by distance between the present point and respective singularity points in every singularity point.

According to a fifteenth aspect of the present invention, in the fourteenth aspect, there is provided a route determination support device, wherein the given order in every respective singularity point is updated in such a way that in every time when the present point approaches within prescribed distance from the target point, it causes the singularity point positioned at the side of end point of the outline route by one to be starting point.

According to a sixteenth aspect of the present invention, in the ninth aspect, there is provided a route determination support device, wherein the singularity point calculation means causes the position in which wiring for changing layer through a via (through hole) on the outline route to be a singularity point.

According to a seventeenth aspect of the present invention, in the ninth aspect, there is provided a route determination support device, wherein one passing through point is taken to be "current", and a passing through point positioned at the starting point side by one with respect to the passing through point to be the "current" on the outline route is taken to be "prev", further a passing through point positioned at the end point side by one with respect to the passing through point to be the "current" on the outline route is taken to be "next", and wherein there is further provided a first judgement means for judging whether or not angle between original direction of route connecting the "prev" with the "current" and new direction of route connecting the "current" with the "next" is more than the prescribed value, wherein when the first judgement means judges that the angle between original direction of route connecting the "prev" with the "current" and new direction of route connecting the "current" with the "next" is more than the prescribed value, the singularity point calculation means calculates the "current" as the singularity point.

According to an eighteenth aspect of the present invention, in the seventeenth aspect, there is provided a route determination support device, which further comprises a second judgement means for judging whether or not a layer in which the "current" exists and a layer in which the "next" are the same layers, wherein when the second judgement means judges that the layer in which the "current" exists differs from the layer in which the "next" exists, the singularity calculation means calculates the singularity point on the route connecting the "current" with the "next".

According to a nineteenth aspect of the present invention, in the eighteenth aspect, there is provided a route determination support device, which further comprises a third judgement means for judging whether or not a first end point and a second end point are already wired when a plurality of end points of the wiring operation exist on the printed wiring substrate, a fourth judgement means, when the third judgement means judges that the already wired wiring exists, for judging whether or not a T-character wiring from the starting point is capable of being performed at position which the via (through hole) on said already wired wiring with respect to the already wired wiring, and/or is capable of being performed in any position on the already wired wiring, and a fifth judgement means, when the fourth judgement means judges that the T-character wiring is possible in the position where the via (through hole) on the already wired wiring exists, for judging whether or not the target point calculated by the target point calculation means from the T-character outline route displayed on the screen to be ideal route exists within prescribed distance determined beforehand from the position of the via (through hole), wherein when the fifth judgement means judges that the target point exists within the prescribed distance from the position of the via, the display means displays new outline route for executing connection at position of the via.

According to a twentieth aspect of the present invention, in the nineteenth aspect, there is provided a route determination support device, wherein when the fifth judgement means judges that the target point does not exist within the prescribed distance from the position of the via, the display means displays new outline route having a target point existing within the prescribed distance from the position of another via on said already wired wiring.

According to a twenty-first aspect of the present invention, in the twentieth aspect, there is provided a route determination support device, which further comprises a sixth judgement means for judging whether or not the target point calculated from the T-character outline route by the target point calculation means exists within the prescribed distance from a spot positioned in the most nearest place to the starting point on the already wired wiring when the fourth judgement means judges that the T-character wiring is capable of being performed in any position on the already wired wiring, wherein when the sixth judgement means judges that the target point exists within the prescribed distance from the spot, the display means displays new outline route for the sake of connection at the spot.

According to a twenty-second aspect of the present invention, in the twenty-first aspect, there is provided a route determination support device, wherein when the sixth judgement means judges that the target point does not exist within the prescribed distance from the spot, the display means displays new outline wiring which has a target point existing within the prescribed distance from the already wired wiring.

According to a twenty-third aspect of the present invention, there is provided a storage medium storing therein a program for executing processing of a processing for inputting information for determining the route by a input means, a processing for searching position of a singularity point with direction switching property of the route by a singularity point position calculator, a processing for storing therein data of the singularity point calculated by the singularity point position calculator by a singularity point storage unit, a processing for selecting a point with the shortest distance from among calculated distances as a target point while calculating distance between the position of the singularity point stored in the singularity point storage unit and a present position utilizing priority of wiring order determined beforehand a target point calculator, and a processing for displaying ratsnest concerning progress and/or result of route determination operation by an output unit.

According to a twenty-fourth aspect of the present invention, in the twenty-third aspect, there is provided a storage medium storing therein a program for executing processing, wherein there is provided processing of extracting at least one target point whose angle between newly progressing direction of the route and original progressing direction of the route is more than certain threshold value as the singularity point from outline route displayed on a screen of the output unit by means of target point calculator.

According to a twenty-fifth aspect of the present invention, in the twenty-third aspect, there is provided a storage medium storing therein a program for executing processing, wherein there is provided processing of selecting a point at which progressing direction of the outline route changes into vertical direction with respect to plane of wiring route as the singularity point by means of target point calculator.

According to a twenty-sixth aspect of the present invention, in the twenty-third aspect, there is provided a storage medium storing therein a program for executing processing, wherein there is provided processing of extracting the target point from among the singularity points on the basis of result of multiplying coefficients in accordance with given order to respective singularity points from start point side of the outline route by distance between the present point and respective singularity point in every singularity point by means of the target point calculator.

According to a twenty-seventh aspect of the present invention, in the twenty-sixth aspect, there is provided a storage medium storing therein a program for executing processing, wherein the coefficients increase in accordance with the given order with respect to respective singularity points.

According to a twenty-eighth aspect of the present invention, in the twenty-seventh aspect, there is provided a storage medium storing therein a program for executing processing, wherein there is provided processing of extracting one and/or a plurality of target points from the singularity points with small value from among the results obtained by multiplying the coefficients by the distance between the present point and respective singularity points in every singularity point by means of the target point calculator.

According to a twenty-ninth aspect of the present invention, in the twenty-third aspect, there is provided a storage medium storing therein a program for executing processing, wherein the given order in every respective singularity point is updated in such a way that in every time when the present point approaches within prescribed distance from the target point, it causes the singularity point positioned at the side of end point of the outline route by one to be starting point.

According to a thirty aspect of the present invention, in the twenty-third aspect, there is provided a storage medium storing therein a program for executing processing, which further comprises the processing of a processing for acquiring the passing through point of the outline route displayed on a screen to be ideal route by means of a passing through point acquisition means, a processing for calculating at least one singularity point on the basis of prescribed condition from among the acquired passing through points by means of a singularity point calculation means, a processing for calculating distance between the calculated singularity points and the present point whose position is movable on the screen by means of a distance calculation means, a processing for multiplying the coefficient in accordance with order which is given to respective singularity points from the starting point side of the outline route on the outline route by the distance calculated by the distance calculation means, a processing for calculating at least one target point from among the singularity point on the basis of the result of the multiplication by means of a target point established means, and a processing for displaying a straight line for connecting at least one target point established previously with the present point by means of a display means.

According to a thirty-first aspect of the present invention, in the twenty-third aspect, there is provided a storage medium storing therein a program for executing processing, which further comprises the processing of a processing for acquiring the passing through point on matrix-shaped frame dividing the whole printed wiring substrate according to displayed outline route on the screen to be ideal route by means of a passing through point acquisition means, a processing for calculating at least one singularity point on the basis of prescribed condition from among the acquired passing through points by means of a singularity point calculation means, a processing for calculating distance between the calculated singularity point and an operation point to be a pointed end place of a wiring operation by means of a distance calculation means, a processing for multiplying the coefficient in accordance with order which is given to respective singularity points from the starting point side of the outline route on the outline route by the distance calculated by the distance calculation means, a processing for calculating at least one target point from among the singularity point on the basis of the result of the multiplication by means of a target point established means, and a processing for displaying a straight line for connecting at least one target point established previously with the present point by means of a display means.

According to a thirty-second aspect of the present invention, in the thirty aspect, there is provided a storage medium storing therein a program for executing processing, which further comprises the processing of extracting at least one target point whose angle between newly progressing direction of the route and original progressing direction of the route is more than certain threshold value as the singularity point from outline route displayed on a screen of the output unit by means of singularity point calculation means.

According to a thirty-third aspect of the present invention, in the twenty-third aspect, there is provided a storage medium storing therein a program for executing processing, which further comprises the processing of selecting a point at which progressing direction of the outline route changes into vertical direction with respect to plane of wiring route as the singularity point by means of the singularity point calculation means.

According to a thirty-fourth aspect of the present invention, in the thirty aspect, there is provided a storage medium storing therein a program for executing processing, which further comprises the processing of extracting the target point from among the singularity points on the basis of result of multiplying coefficients in accordance with given order to respective singularity points from start point side of the outline route by distance between the present point and respective singularity point in every singularity point by means of the target point calculation means.

According to a thirty-fifth aspect of the present invention, in the thirty-fourth aspect, there is provided a storage medium storing therein a program for executing processing, wherein the coefficients is coefficient which increases in accordance with given order with respect to respective singularity points.

According to a thirty-sixth aspect of the present invention, in the thirty aspect, there is provided a storage medium storing therein a program for executing processing, which further comprises the processing of extracting one and/or a plurality of target point from the singularity points with small value from among the results obtained by multiplying the coefficient by distance between said present point and respective singularity points in every singularity point by means of said singularity point calculation means.

According to a thirty-seventh aspect of the present invention, in the twenty-third aspect, there is provided a storage medium storing therein a program for executing processing, wherein the given order in every respective singularity point is updated in such a way that in every time when the present point approaches within prescribed distance from the target point, it causes the singularity point positioned at the side of end point of the outline route by one to be starting point.

According to a thirty-eighth aspect of the present invention, in the thirty aspect, there is provided a storage medium storing therein a program for executing processing, which further comprises the processing of causing the position in which wiring for changing layer through a via (through hole) on the outline route to be a singularity point by means of the singularity point calculation means.

According to a thirty-ninth aspect of the present invention, in the thirty aspect, there is provided a storage medium storing therein a program for executing processing, wherein one passing through point is taken to be "current", and a passing through point positioned at the starting point side by one with respect to the passing through point to be the "current" on the outline route is taken to be "prev", further a passing through point positioned at the end point side by one with respect to the passing through point to be the "current" on the outline route is taken to be "next", and wherein there is further provided a first judgement means for judging whether or not angle between original direction of route connecting the "prev" with the "current" and new direction of route connecting the "current" with the "next"

is more than the prescribed value, wherein when the first judgement means judges that the angle between original direction of route connecting the "prev" with the "current" and new direction of route connecting the "current" with the "next" is more than the prescribed value, the singularity point calculation means calculates the "current" as the singularity point.

According to a fortieth aspect of the present invention, in the thirty-ninth aspect, there is provided a storage medium storing therein a program for executing processing, which further comprises the processing of a processing for judging whether or not a layer in which the "current" exists and a layer in which the "next" are the same layers by means of a second judgement means, wherein when the second judgement means judges that the layer in which the "current" exists differs from the layer in which the "next" exists, the singularity calculation means calculates the singularity point on the route connecting the "current" with the "next".

According to a forty-first aspect of the present invention, in the forty aspect, there is provided a storage medium storing therein a program for executing processing, which further comprises the processing of a processing for judging whether or not a first end point and a second end point are already wired when a plurality of end points of the wiring operation exist on the printed wiring substrate by means of a third judgement means, a processing for judging whether or not a T-character wiring from the starting point is capable of being performed at position which the via (through hole) on the already wired wiring with respect to the already wired wiring, and/or is capable of being performed in any position on the already wired wiring by means of a fourth judgement means, when the third judgement means judges that the already wired wiring exists, and a processing for judging whether or not the target point calculated by the target point calculation means from the T-character outline route displayed on the screen to be ideal route exists within prescribed distance determined beforehand from the position of the via (through hole) by means of a fifth judgement means, when the fourth judgement means judges that the T-character wiring is possible in the position where the via (through hole) on the already wired wiring exists, wherein when the fifth judgement means judges that the target point exists within the prescribed distance from the position of the via, the display means displays new outline route for executing connection at position of the via.

According to a forty-second aspect of the present invention, in the forty-first aspect, there is provided a storage medium storing therein a program for executing processing, wherein when the fifth judgement means judges that the target point does not exist within the prescribed distance from the position of the via, the display means displays new outline route having a target point existing within the prescribed distance from the position of another via on the already wired wiring.

According to a forty-third aspect of the present invention, in the forty aspect, there is provided a storage medium storing therein a program for executing processing, which further comprises the processing of a processing for judging whether or not the target point calculated from the T-character outline route by the target point calculation means exists within the prescribed distance from a spot positioned in the most nearest place to the starting point on the already wired wiring when the fourth judgement means judges that the T-character wiring is capable of being performed in any position on the already wired wiring by means of a sixth judgement means, wherein when the sixth judgement means judges that the target point exists within the prescribed distance from the spot, the display means displays new outline route for the sake of connection at said spot.

According to a forty-fourth aspect of the present invention, in the forty-third aspect, there is provided a storage medium storing therein a program for executing processing, which further comprises the processing of a processing for judging that the target point does not exist within the prescribed distance from the spot, the display means displays new outline wiring which has a target point existing within the prescribed distance from the already wired wiring.

According to a forty-fifth aspect of the present invention, there is provided a printed substrate wiring method which comprises the steps of a step for inputting information for determining the route by a input means, a step for searching position of a singularity point with direction switching property of the route by a singularity point position calculator, a step for storing therein data of the singularity point calculated by the singularity point position calculator by a singularity point storage unit, a step for selecting a point with the shortest distance from among calculated distances as a target point while calculating distance between the position of the singularity point stored in the singularity point storage unit and a present position utilizing priority of wiring order determined beforehand a target point calculator, and a step for displaying ratsnest concerning progress and/or result of route determination operation by an output unit.

According to a forty-sixth aspect of the present invention, there is provided a printed substrate wiring method which further comprises the step of extracting at least one target point whose angle between newly progressing direction of the route and original progressing direction of the route is more than certain threshold value as the singularity point from outline route displayed on a screen of the output unit by means of target point calculator.

According to a forty-seventh aspect of the present invention, in the forty-fifth aspect there is provided a printed substrate wiring method which further comprises the step of selecting a point at which progressing direction of the outline route changes into vertical direction with respect to plane of wiring route as the singularity point by means of target point calculator.

According to a forty-eighth aspect of the present invention, in the forty-fifth aspect there is provided a printed substrate wiring method which further comprises the step of extracting the target point from among the singularity points on the basis of result of multiplying coefficients in accordance with given order to respective singularity points from start point side of the outline route by distance between the present point and respective singularity point in every singularity point by means of the target point calculator.

According to a forty-ninth aspect of the present invention, in the forty-eighth aspect there is provided a printed substrate wiring method, wherein said coefficients increase in accordance with the given order with respect to respective singularity points.

According to a fiftieth aspect of the present invention, in the forty-ninth aspect there is provided a printed substrate wiring method which further comprises the step of extracting one and/or a plurality of target points from the singularity points with small value from among the results obtained by multiplying the coefficients by the distance between the present point and respective singularity points in every singularity point by means of the target point calculator.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 1 is a view explaining an outline route in the prior art;

FIG. 5 is a first view for explaining extract of singularity point from the outline route in the embodiment of the present invention;

FIG. 7 is a flowchart showing flow of extract operation of singularity point according to a singularity point position calculator in the embodiment of the present invention;

FIG. 11 is a view showing an outline constitution of large area wiring in the case where parts to be connected to a start point exists more than two;

FIG. 16 is a flowchart showing flow of processing operation for deciding the outline route displayed in the another embodiment of the present invention.

DETAILED DESCRIPTION OF THE PREFERRED EMBODIMENTS

A preferred embodiment of the present invention will be described in detail in accordance with the accompanying drawings.

Figure 2:
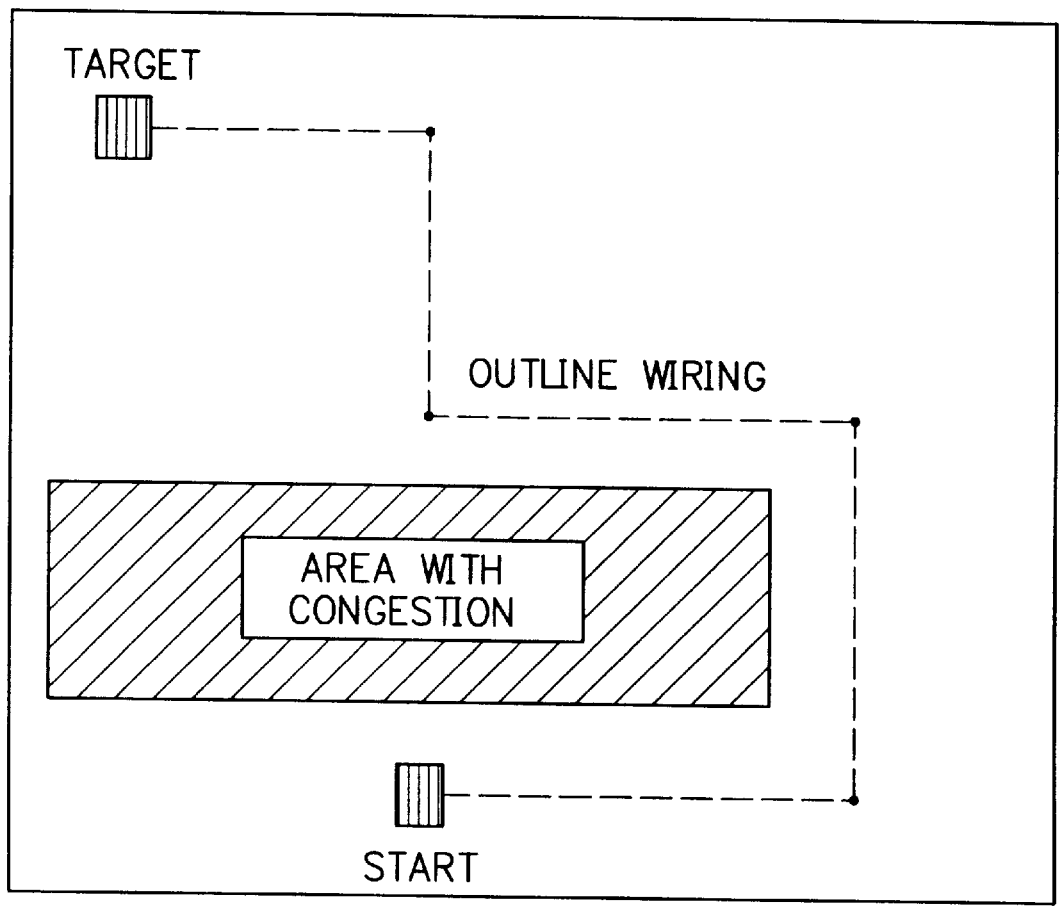
FIG. 2 is a view showing one example of the outline route in the prior art.
Figure 3:
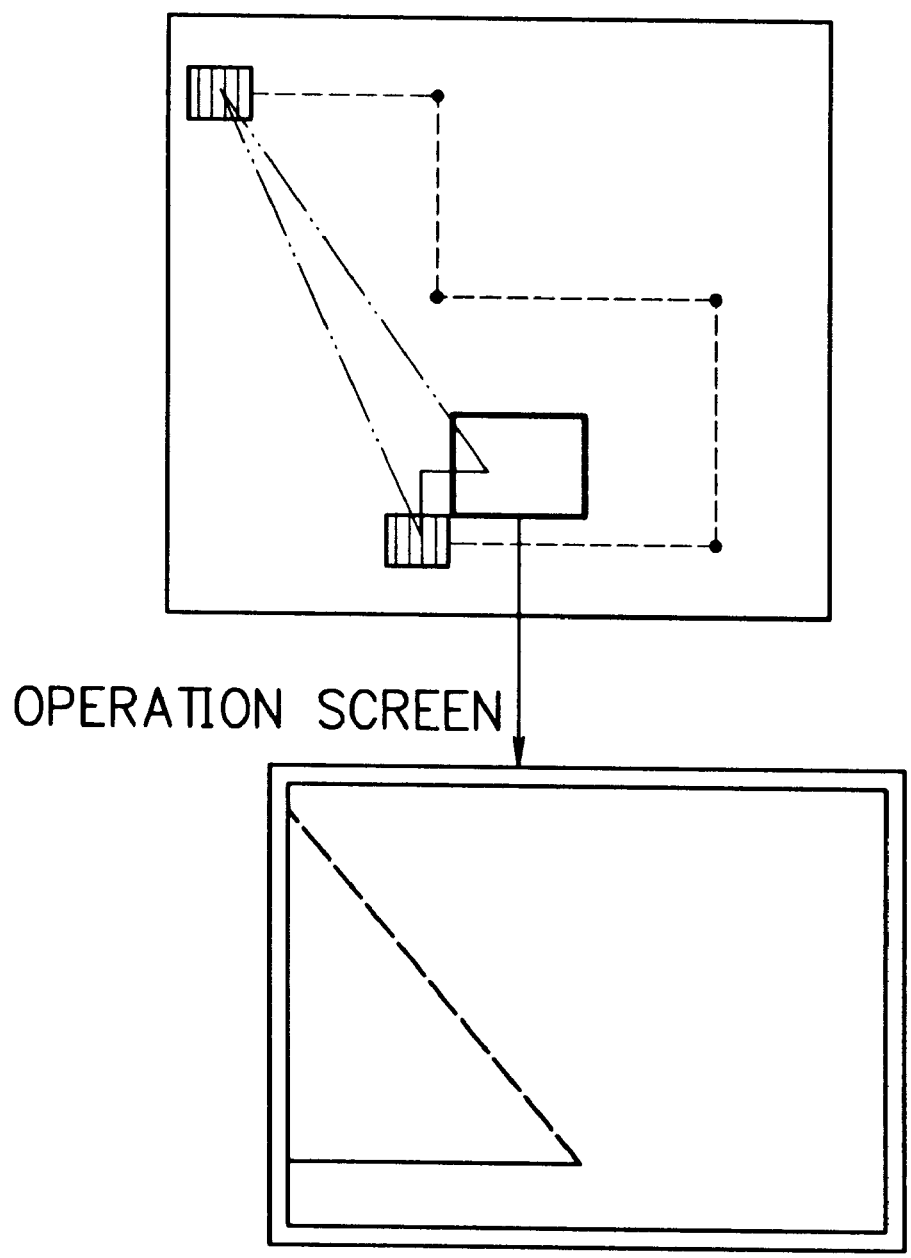
FIG. 3 is a view for explaining the state in which the operator executes actual wiring operation while referring to the ratsnest in the prior art.
Figure 4:
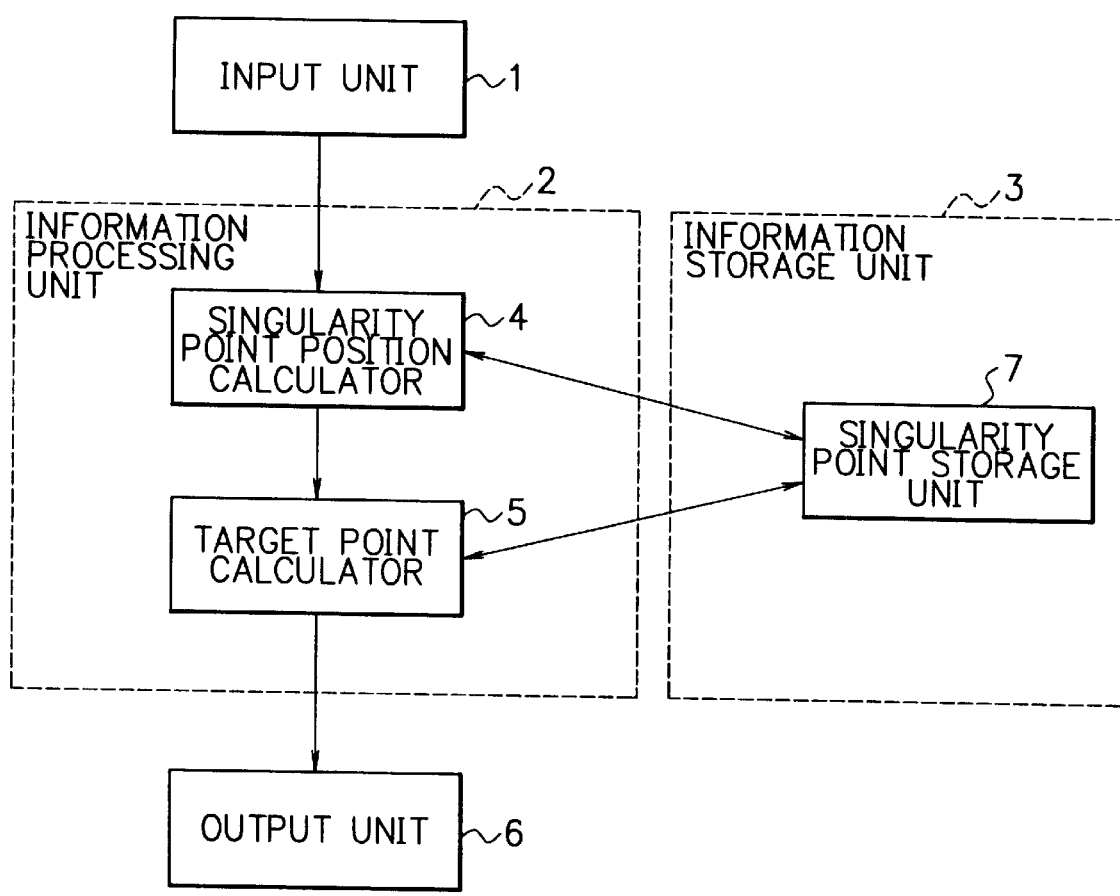
FIG. 4 is a block diagram showing outline constitution of a ratsnest display device in an embodiment of the present invention.

Here, as one embodiment, there will be described a case where it causes a display system of ratsnest of the present invention to be applied to a print substrate wiring operation. FIG. 4 is a block diagram showing outline constitution of a ratsnest display device in the present embodiment. As shown in FIG. 4, the ratsnest display device comprises an input unit 1 of a keyboard and so forth, an information processor 2 operating due to program control, an information storage unit 3 for storing therein information, and an output unit 6 of a display unit, a print unit, and so forth.

The information processor 2 consists of a singularity point position calculator 4 for calculating position of a singularity point which is described after, and a target point calculator 5 for calculating the target point while giving prescribed calculation about the singularity point calculated by the singularity point position calculator 4. Outline operation of the singularity point position calculator 4 is that the singularity point position calculator 4 calculates coordinate of the singularity point on an ideal wiring route (hereinafter referred to as outline route) which is completed to be inputted from the input unit 1, before causing calculation result to be stored in the singularity point storage unit 7.

Here, the singularity point represents points on the outline route. The singularity point is a point where the wiring is bent. The singularity point is a point where wiring layer is changed in the multi-layer printed substrate.

There will be described operation of the target point calculator 5 roughly. A position of the pointed head where the operator implements wiring operation is operation point. The target point calculator 5 calculates a target point from the operation point and the coordinates of the singularity points more than one stored in the singularity point storage unit 7. The result calculated by the target point calculator 5 is outputted to the output unit 6. The output unit 6 displays a straight line (ratsnest) connecting the operation point with the end point of the wiring operation and a straight line (outline route navigate ratsnest) connecting the target point and the operation point. Further, the operation point is updated with progression of the wiring operation by the operator, before the information processor 2 calculates the target point in answer to updated operation point in such a way that the information processor 2 repeats above described processing according to respective parts, thus causing the ratsnest and the outline route navigate ratsnest to be displayed on the output unit 6.

Next, there will be described operation of the present embodiment referring to FIGS. 4, and 5. The input unit 1 informs a substrate form, parts information, parts position, connection information, design specification and so forth. These are information necessary for ordinary design. Further, the input unit 1 informs provisional outline route which is calculated such that it enables the wiring to be implemented efficiently in consideration of the whole substrate, information of the parts of which the operator starts the wiring, and so forth.

The singularity point position calculator 4 calculates the singularity point to be the point of representing the outline route. It causes the singularity point to be calculated from the large area wiring route having information of the coordinates value with constant interval on the route as shown in FIG. 5 as the outline route. There exists a point to which "veer" is struck in order to implement wiring while changing layer, or a point from which progression direction of the wiring is different more than 45 degrees with respect to the straight line, as shown in FIG. 5. These points are calculated as the singularity points. The coordinates of the singularity point is stored in the singularity point storage unit.

Here, there will be described the large area wiring route. The large area wiring route enables rough wiring route to be searched while observing the state of the whole printed substrate at high speed. On this occasion, the printed substrate is sectioned into matrix-shaped frame, thus deciding that it causes which matrix-shaped frame to be passed in every net. At this time, the inside of the one matrix-shaped frame is observed locally. It is considered that it causes the area which is congested extremely or whose relative difficulty of the wiring is extremely high not to be formed.

The above described singularity point position calculator 4 calculates the singularity point. There will be described the case where the point is calculated as the singularity point whose progression direction is bent by more than 45 degrees from the straight line with direction just before making a turn referring to FIG. 5. The input unit 1 inputs therein the outline route (here referred to as above-described large area wiring route). The points passing through one side of respective matrix-shaped frames are taken to be a point "a", a point "b", a point "c", and a point "d". An angle (A) is constituted by a route of connecting a start spot with the point "a" and a route of connecting the point "a" with the point "b". An angle (B) is constituted by a route of connecting the point "a" with the point "b" and a route of connecting the point "b" with the point "c". An angle (C) is constituted by a route of connecting the point "b" with the point "c" and a route of connecting the point "c" with the point "d". An angle (D) is constituted by a route of connecting the point "c" with the point "d" and a route of connecting the point "d" with the target spot. It is judged whether or not each angle (A), (B), (C), or (D) is more than 45 degrees. Namely, it is judged whether or not direction of progression wiring is different from the original direction of progression wiring by more than 45 degrees. Since direction of progression wiring different from the original direction of progression wiring by more than 45 degrees is only the point "c", the singularity point position calculator 4 selects the point "c" as the singularity point.

The singularity point "c" calculated is connected to the start spot, and the singularity point "c" is connected to the target spot as shown in FIG. 5. FIG. 5 shows such the route in which the singularity point "c" is connected to the start spot and the singularity point "c" is connected to the target spot by the straight line respectively. As is clear in comparison with two of FIG. 5, the route in which the singularity point (the point "c") calculated with the above condition is taken to be passing point is capable of indicating summary of the outline route with the point "a", the point "b", the point "c", and the point "d" as the passing points. The singularity point position calculator 4 calculates the point "c" with such the characteristics as the singularity point.

In this case, only one singularity point is calculated from the outline route. However, if there exists a plurality of points whose respective angles are more than 45 degrees between direction of progression of the wiring and original direction of progression of the wiring on the outline route, the singularity point position calculator 4 calculates respective points as the singularity point.

Further, here, points whose respective angles are more than 45 degrees between direction of progression of the wiring and original direction of progression of the wiring on the outline route, are calculated as the singularity points. However, there is a point which is capable of being calculated as the singularity point except for the above described point. Such the point has characteristics that it enables summary of the outline route to be shown by executing connection.

The singularity point position calculator 4 implements another calculation operation for the singularity point. The singularity point position calculator 4 calculates position of a via (through hole) in printed substrate of multi-layer construction. There will be described one example of singularity point calculation of the via referring to FIGS. 6A, 6B.

Figure 6A:
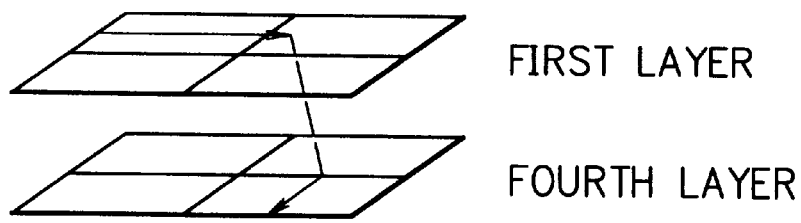
FIGS. 6A, 6B are second views for explaining extract of singularity point from the outline route in the embodiment of the present invention.
Figure 6B:
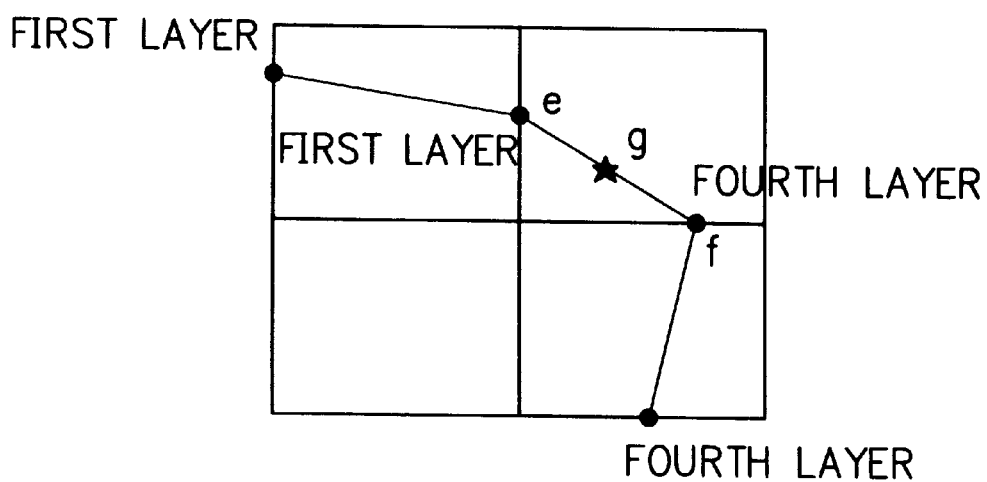

FIGS. 6A and 6B show the state where the wiring is implemented while utilizing the via between a first layer and a fourth layer. As is obvious from FIG. 6A, the via is a point which should be passed inevitably in the practical wiring operation. The via has significance as the representative point representing characteristics of the outline route. FIG. 6B is a view which is observed from the side of the first layer of the wiring configuration on the multi-layer construction substrate shown in FIG. 6A. Here, on the supposition that there exists the via at the midpoint of the route connecting between the point "e" and the point "f". The singularity point position calculator 4 calculates the midpoint "g" as the singularity point.

Here, from the above described outline route as the example, on the supposition that the via exists at the midpoint of the route connecting between the point "e" and the point "f", thus the singularity point position calculator 4 calculates the midpoint "g" as the singularity point. However, it is not limited by this condition, but any position is capable of being calculated as the singularity position in answer to the existence position of the via.

The target point calculator 5 calculates distance between the operation point and respective singularity points from the coordinates information of respective singularity point stored in the singularity point storage unit 7. The calculated distance in every singularity point is multiplied by a coefficient in answer to wiring arrangement order respectively. The point which becomes the smallest value from among the values obtained by such multiplication is taken to be present target point. The calculated distance in every singularity point is multiplied by a coefficient in answer to wiring arrangement order respectively, because it is incapable of making the best use of such the distance information between the operation point and the respective singularity point. The reason why the target point calculator 5 decides the target point by only preference of distance, thus causing the target point to be decided while ignoring the wiring arrangement order when detour wiring is efficient.

There will be described calculation operation of target point according to the target point calculator 5 while employing distance between the operation point and respective singularity points, wiring arrangement order, and concrete example of the coefficient in accordance with the wiring arrangement order.

The distance between the operation point and the singularity points, the wiring arrangement order, and the coefficient in accordance with the wiring arrangement order are shown as follows:

[operation point→singularity point "g"]distance: 65 order of "g"=1 coefficient=1.0

[operation point→singularity point "h"]distance: 90 order of "h"=2 coefficient=1.2

[operation point→singularity point "i"]distance: 50 order of "i"=3 coefficient=1.4

[operation point singularity point "j"]distance: 100 order of "j"=4 coefficient=1.6

The distance between the operation point and the respective singularity point is multiplied by the coefficient in accordance with the wiring arrangement order. The values are obtained with respect to the above respective points "g", "h", "i", and "j". Values 65 about the singularity point "g", 108 about the singularity point "h", 70 about the singularity point "I", and 160 about the singularity point "j" are obtained. Therefore, the target point calculator 5 selects the singularity point "g" which takes the most smallest value as the target point.

Further, when the operation point approaches neighborhood of the target point calculated beforehand within fixed distance, the target point calculator 5 regards that the operation point gets the target point. The target point calculator 5 re-observes the wiring arrangement order and the coefficient in accordance with the wiring arrangement order, thus calculating new target point while repeating the same processing.

[operation point→singularity point "h"]distance: 50 order of "h"=1 coefficient=1.0

[operation point→singularity point "i"]distance: 90 order of "i"=2 coefficient=1.2

[operation point→singularity point "j"]distance: 120 order of "j"=3 coefficient=1.4

The values are obtained with respect to the above respective points "h", "i", and "j". Values 50 about the singularity point "h", 108 about the singularity point "i", and 168 about the singularity point "j" are obtained. Therefore, the target point calculator 5 selects the singularity point "i" which takes the most smallest value as the target point.

Here, fixed distance is set to 0.5 to 1.0 times of one side of matrix-shaped frame with the printed substrate divided into checkered shape.

Further, the coefficient in accordance with wiring arrangement order given to the respective singularity points are capable of being set suitably according to demand. For instance, when there is attempted to show the outline route navigate ratsnest depending on distance between the operation point and the target point, the smaller value than above-described coefficient is set. For instance, it causes the first of the wiring arrangement order to be set to 1.1. It causes the second of the wiring arrangement order to be set to 1.2. It causes the third of the wiring order to be set to 1.3. It causes the fourth of the arrangement order to be set to 1.4.

Furthermore, when there is attempted to show the outline route navigate ratsnest depending on the wiring arrangement order, the larger value than above-described coefficient value is set. For instance, it causes the first of the wiring arrangement order to be set to 1.5. It causes the second of the wiring arrangement order to be set to 2.0. It causes the third of the wiring order to be set to 2.5. It causes the fourth of the arrangement order to be set to 3.0.

There will be described calculation operation of the singularity point in detail in the singularity point position calculator 4 referring to the flowchart shown in FIG. 7.

Firstly, the operator selects a net for implementing a wiring operation. On this occasion, the output unit 6 displays an outline route in accordance with selection of the net. The singularity point position calculator 4 obtains passing through point coordinates of the outline route on respective matrix-shaped frame causing the whole printed substrate to be divided into checkered shape (STEP S11).

Figure 8:
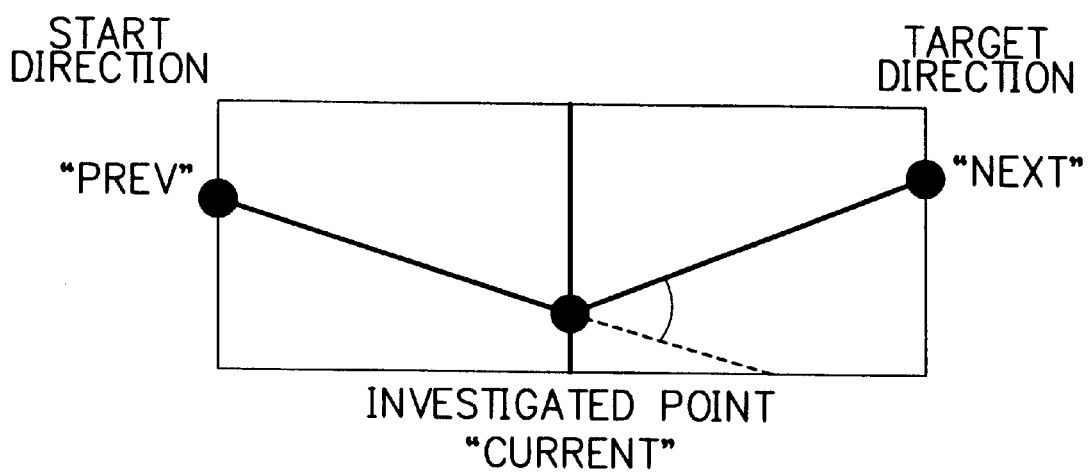
FIG. 8 is a view for explaining extract operation of singularity point according to the singularity point position calculator in the embodiment of the present invention.

Here, on the occasion of calculation of the singularity point, the passing through point coordinates of the outline route which the singularity point position calculator 4 obtains is prescribed as shown in FIG. 8. The singularity point position calculator 4 explores one passing through point coordinates whether or not it causes the passing through point coordinates to be the singularity point. Such the passing through point coordinates is taken to be "current". In the same outline route, the passing through point existing in the start place side by one with regard to the point decided as the "current" is taken to be "prev". Further, in the same outline route, the passing through point existing in the target place side by one with regard to the point decided as the "current" is taken to be "next".

The singularity point position calculator 4 explores whether or not it causes the respective passing through point to be the singularity point along the outline route from the start place to the target place. Firstly, the singularity point position causes the start place to be set to be the "current" (STEP S12). The singularity point position calculator 4 determines whether both of a layer in which the start place ("current") exists and a layer in which the "next" with respect to the present "current" exists are the same layer, or are different layer (STEP S13).

In the determination of STEP S13, when there is determined that the "current" and the "next" exist in the different layer (STEP S13/YES), it is necessary to connect the "current" with the "next" which exist in different layer while utilizing the via (through hole). In order to connect the "current" with the "next" while utilizing the via (through hole), the singularity point position calculator 4 sets the place of the via (through hole) existing in the midpoint on the straight line route connecting the "current" with the "next" to be the singularity point (STEP S14), before proceeding to processing of STEP S17 describing after.

Further, in the determination of STEP S13, when there is determined that the "current" and the "next" exist in the same layer (STEP S13/NO). There is one route on the outline route connecting the present "current" with the "prev" with respect to the present "current". There is the other route on the outline route connecting the present route with the "next" with respect to the present "current". The singularity point position calculator 4 determines whether or not the angle between the route connecting the "current" and the "prev", and the route connecting the "current" and the "next" are different more than 45 degrees (STEP S15).

In this initial stage, the start place is set to the "current", therefore, the "prev" does not exist, thus determination of STEP S15 is not implemented, before proceeding the processing to STEP S17. It causes the passing through point as the "next" to be set to be the "current", before returning to the processing of STEP S13.

The start place is not set as the "current". In the processing of STEP S15, the singularity point position calculator 4 determines that the angle between the route on the outline route connecting the "current" and the "prev", and the route on the outline route connecting the "current" and the "next" are different more than 45 degrees (STEP S15/YES). On this occasion, the present "current" is set to the singularity point (STEP S16), before proceeding to STEP S17.

Furthermore, in STEP S15, the angle between the route on the outline route connecting the present "current" and the "prev" corresponding to the "current", and the route on the outline route connecting the "current" and the "next" corresponding to the "current" is less than 45 degrees (STEP S15/NO). The present "current" is taken to be the "next", and further present "prev" is set to the "current" (STEP S17).

After processing of STEP S17, the singularity point position calculator 4 determines whether or not the newly established "current" is the target place to be the last point (STEP S18). In the determination of STEP S18, when the newly established "current" is determined to be the target place (STEP S18/YES), an outline route is displayed on the output unit 6 in accordance with the net selected by the operator again. The singularity point position calculator 4 executes processing described above to calculate the singularity point from the outline route. In the processing of STEP S18, when the newly established "current" is determined that the "current" newly established is not the target place (STEP S18/NO), returning to STEP S13.

The singularity point position calculator 4 calculates the singularity point according to processing shown by the flowchart of above FIG. 7. The singularity point storage unit 7 stores therein the position coordinates of the singularity point. The target point calculator 5 inputs therein the operation point from the input unit 1 through the singularity point position calculator 4. The target point calculator 5 calculates distance between the operation point and the respective singularity point stored in the singularity point storage unit 7. The target point calculator 5 calculates a target point from the singularity point stored in the singularity point storage unit 7 on the basis of the distance obtained about the respective singularity points calculated here and the coefficient in accordance with the wiring arrangement order.

Figure 9:
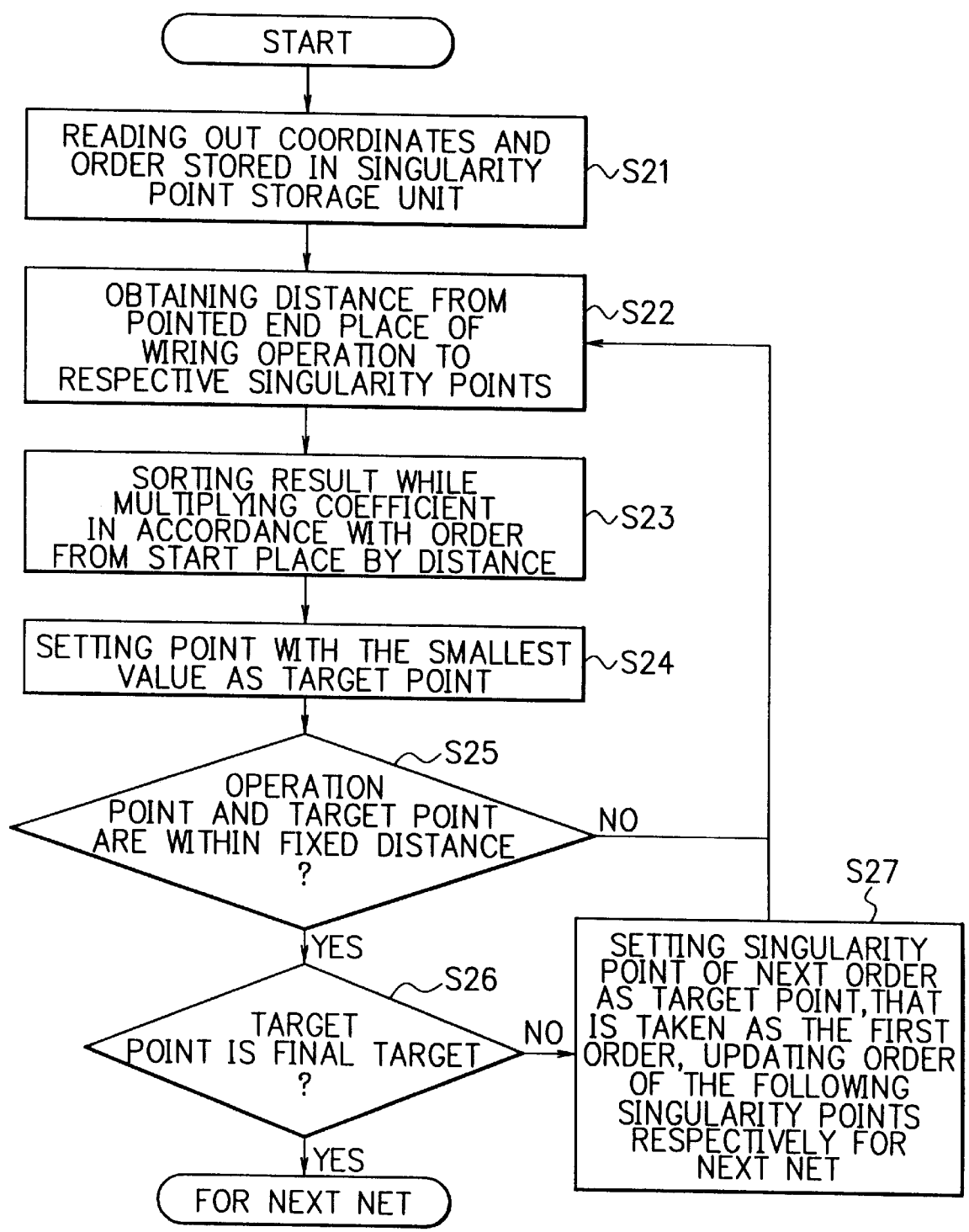
FIG. 9 is a flowchart showing flow of operation of target point calculation according to a target point calculator in the embodiment of the present invention.

There will be described detailed calculation operation of the target point in the target point calculator 5 referring to flowchart shown in FIG. 9.

The singularity point position calculator 4 calculates the singularity point from one outline route. The singularity point position calculator 4 causes the wiring arrangement order to be given to the respective singularity points in order of the position from the start place on the outline route, before causing the singularity point storage unit 7 to store therein.

The target point calculator 5 reads the position coordinates of the singularity point from the singularity point storage unit 7. Here, the target point calculator 5 reads the position coordinates of the point "g", the position coordinates of the point "h", the position coordinates of the point "i", and the position coordinates of the point "j". The target point calculator 5 reads respective wiring arrangement order corresponding to these singularity points namely, reading the first order about the point "g", the second order about the point "h", the third order about the point "i", and the fourth order about the point "j" (STEP S21).

Next, the target point calculator 5 obtains the pointed head position of the practical wiring operation, namely, obtains distance between the operation point and the respective singularity points (STEP S22). Here, the start place is taken to be the operation point. The distance between the start place (here, operation point) and respective singularity points are 65 about the point "g", 90 about the point "h", 50 about the point "i", and 100 about the point "j".

The target point calculator 5 multiplies the obtained distance by the coefficient in accordance with the order given to respective singularity points. Concretely, with respect to the point "g", 65 is multiplied by 1.0, with respect to the point "h", 90 is multiplied by 1.2, with respect to the point "i", 50 is multiplied by 1.4, with respect to the point "j", 100 is multiplied by 1.6. The multiplication result is as follows: it is 65 about the point "g", 108 about the point "h", 70 about the point "i", and 160 about the point "j". The obtained values are re-arranged in accordance with prescribed standard (to sort) (STEP S23).

Here, the target point calculator 5 sets the singularity point with the smallest value from among the results sorted previously as the target point. Namely, the target point calculator 5 sets the singularity point "g" as the target point (STEP S24). The target point calculator 5 determines whether or not the distance between the operation point and the target point, namely, 65 falls within the fixed distance (for instance 10) set beforehand (STEP S25).

In the determination of STEP S25, the distance between the operation point and the target point, namely 65, does not fall within the fixed distance set beforehand (STEP S25/NO), thus the target point calculator 5 shifts processing to STEP S22. While in the determination of STEP S25, the target point calculator 5 determines that, for instance, the target point is not the start place, but is another target point, and that the distance between the target point and the set target point set beforehand falls within the fixed distance set beforehand (STEP S25/YES). Next, the target point calculator 5 determines whether or not such target point is the target place (STEP S26).

In the determination of STEP S26, the point calculated as the target point is the point "g". Consequently, the target point is not the target place. Thus, the target point calculator 5 determines that the target point is not the target place (STEP S26/NO). The target point calculator 5 updates in such a way that it causes the singularity point with the next wiring arrangement order to be the first order such as the point "h" being the first order, the point "i" being the second order, the point "j" being the third order. Subsequently, the target point calculator 5 updates following wiring arrangement order of the respective singularity points successively (STEP S27). While, in the determination of STEP S26, the target point calculator 5 determines that the present target point is the target place (STEP S26/YES). The outline route corresponding to the net selected by the operator is displayed on the output unit 6 again. The target point calculator 4 executes the processing described above repeatedly with respect to the outline route displayed newly.

Next, there will be described the state in which the operator implements the wiring processing practically while referring to the displayed outline route navigate ratsnest and ratsnest employing FIG. 10A, to FIG. 10C.

Figure 10A:
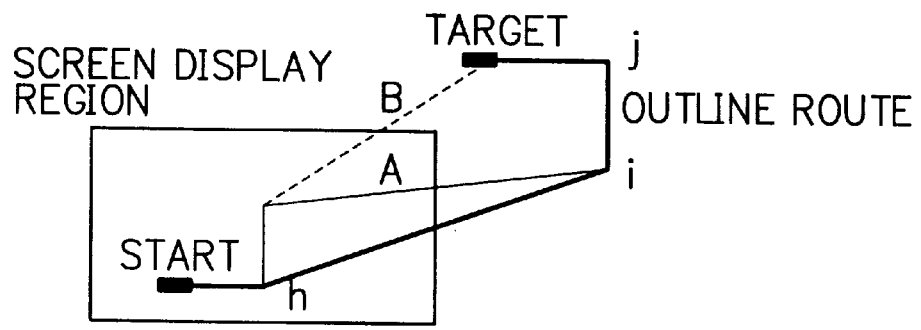
FIGS. 10A, 10B, 10C are views for explaining a state in which the operator implements wiring operation practically while referring to an outline route navigation ratsnest according to the present invention and the ratsnest displayed on the display screen.

In FIG. 10A, the operator implements practical wiring operation from the start place along the outline route displayed. When the operator deviates from the outline route at the position of the point "h" for certain reasons, the output unit 6 displays ratsnest B connecting the present operation point with the target place, simultaneously, the output unit 6 displays outline route navigate ratsnest A showing deviation direction from the outline route while connecting the present operation point with the point "i" calculated as the target point at the target point calculator 5.

Figure 10B:
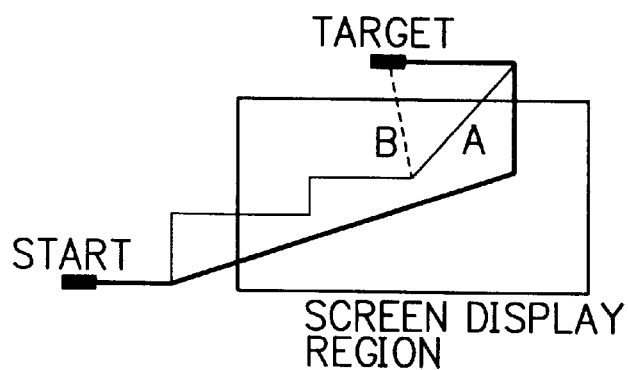
Figure 10C:
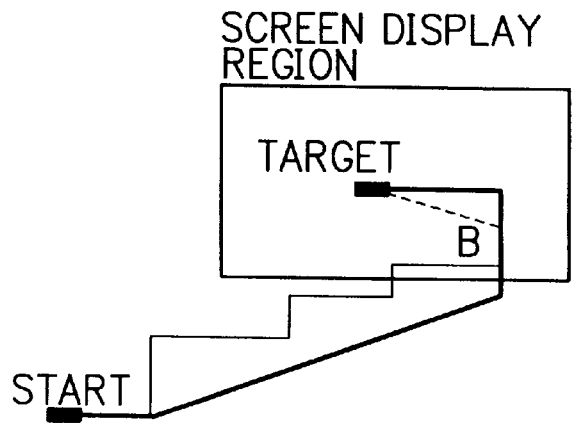

Next, the operator advances wiring in the direction of the target point "i" while referring to the displayed outline route navigate ratsnest A. The operation point approaches the target point "i" within the fixed distance set beforehand. As shown in FIG. 10B, the output unit 6 displays the ratsnest B connecting the present operation point with the target place. The target point calculator 5 calculates new target point "j" from among the singularity points read from the singularity point storage unit 7. The target point calculator 5 displays the outline route navigate ratsnest A while connecting the newly calculated target point "j" with the present operation point.

Further, the operator advances wiring in the direction of the target point "j" while referring to the displayed outline route navigate ratsnest A. The operation point approaches the target point "j" within the fixed distance set beforehand. The target point calculator 5 calculates new target point from among the singularity points read from the singularity point storage unit 7. The target point calculated newly is the target place, therefore, as shown in FIG. 10C, the output unit 6 does not display the outline route navigate ratsnest A, but displays only the ratsnest B connecting the operation point with the target place.

Thus according to the embodiment described above, when there is determined that both of the target point and the operation point exist within fixed distance, the displayed outline route navigate ratsnest at this time becomes the ratsnest connecting the operation point with the another target point. The remaining wiring operation in the neighborhood of the original target point is subjected to the operator. The reason why the operator is capable of grasping state on the printed substrate accurately by visual sensation if the wiring operation is short area wiring operation.

Further, when although the wiring operation which the operator implements practically does not follow the wiring arrangement order given by the singularity point position calculator 4, the outline route navigate ratsnest connecting the target point with the operation point is displayed while being changed the target point into the singularity point when the operation point approaches the one singularity point in certain degree. Therefore, the operator can implement the wiring operation while referring to the outline route navigate ratsnest displayed in accordance with the wiring state, even though the practical wiring operation by the operator depends on the outline route and/or the practical wiring operation to which the will of the operator is reflected.

There will be described another embodiment of the present invention employing FIG. 11. FIG. 11 shows outline constitution of large area wiring where two parts to be connected to the start point exist. Firstly, the operator selects one of two target spots. The operator clarifies that which part is connected to which part on the occasion of wiring.

Next, the operator searches whether or not the specified target spot and another target spot are already practiced the wiring (in this case, target 2 is specified target spot, target 1 is another target spot). When the wiring is already practiced, the singularity point position calculator 4 calculates a singularity point from the outline route displayed on the screen. Further, the target point calculator 5 calculates the target point, simultaneously, the target point calculator 5 determines whether or not T-wiring with respect to wired wiring is capable of being performed. As the determination result, there are three kinds of cases of (1) IMPOSSIBLE, (2) POSSIBLE BY VIA (through hole), (3) POSSIBLE.

Here, (1) IMPOSSIBLE: the T-wiring is not allowed in any position on the already wired wiring. It is only allowed that the start place is connected directly to the target 2 in order to connect to the target 2.

(2) POSSIBLE BY VIA (through hole): It causes the T-wiring to be possible in that connection is only performed at the position of the via (through hole) existing on the already wired wiring.

(3) POSSIBLE: the T-wiring is allowed in any position on the already wired wiring.

Here, there will be described the T-wiring in the cases of (2) POSSIBLE BY VIA (through hole) and (3) POSSIBLE from among the above described determination results referring to FIGS. 12 to 15.

Figure 12A:
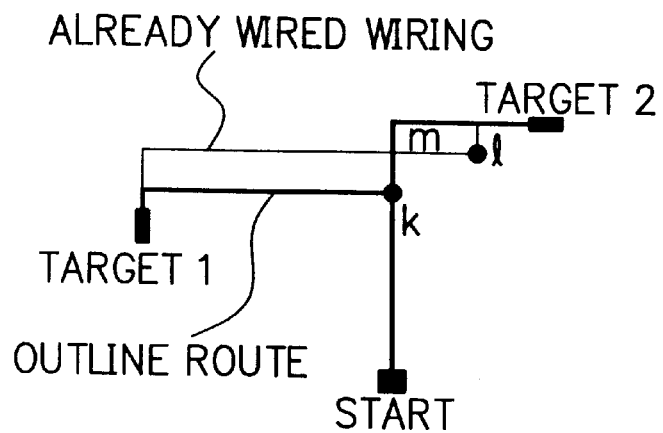
FIGS. 12A, 12B, 12C are views showing a first example of the outline route displayed when it causes T-wiring to be executed in another embodiment of the present invention.
Figure 12B:
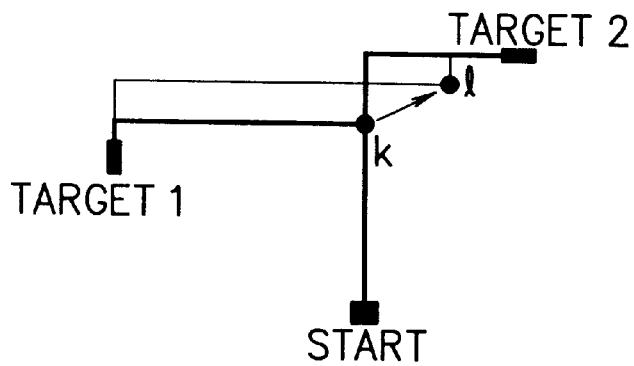
Figure 12C:
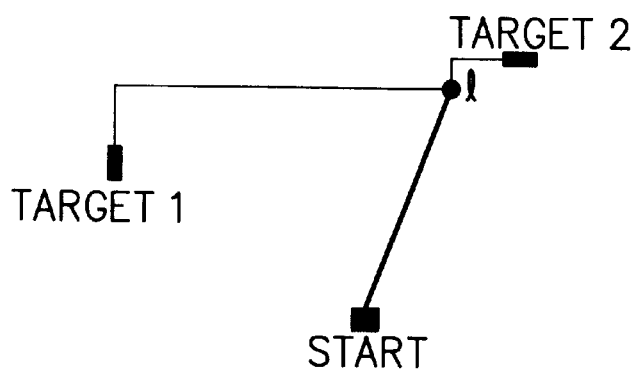

In the cases where there is determined by (2) POSSIBLE BY VIA (through hole), only connection is possible in the position of the via (here point 'l') existing on the already wired wiring connecting the target 1 with the target 2. The target point (here, point 'k') on the T-character outline route (FIG. 12A) is displayed. If the point 'l' exists within the fixed distance set beforehand with respect to the target point 'k' (FIG. 12B), the target point is switched from the point 'k' to the point 'l' before displaying new outline route (FIG. 12C).

Subsequently, the operator advances the wiring operation while referring to the newly displayed outline route shown in FIG. 12C, the outline route navigate ratsnest A for connecting the target point extracted from outline route with the pointed end position of the operation, and the ratsnest B for connecting to the pointed end position of the operation.

Figure 13A:
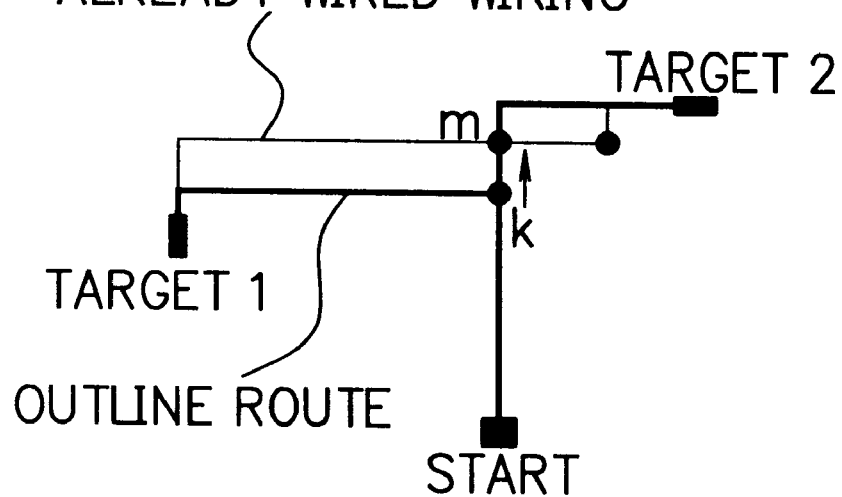
FIGS. 13A, 13B are views showing a second example of the outline route displayed when it causes T-wiring to be executed in another embodiment of the present invention.
Figure 13B:
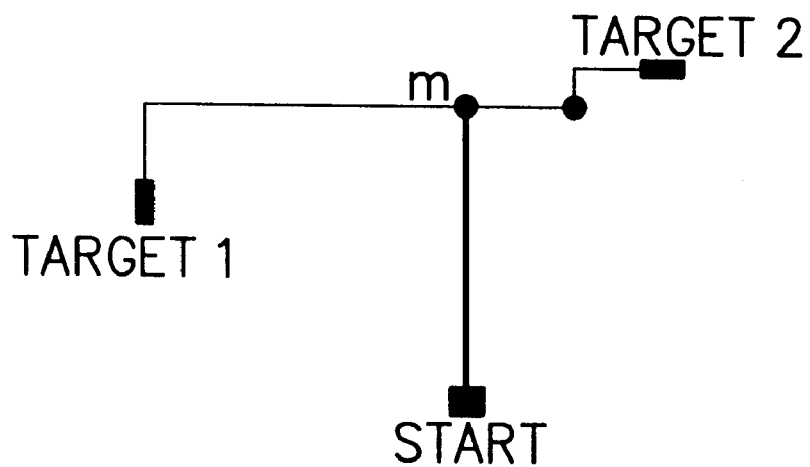

Further, in the cases where there is determined by (3) POSSIBLE, the operator searches a spot existing a position which is the nearest position to the start place in the already wired wiring connecting the target 1 with the target 2. Here, if the point 'm' exists within the fixed distance predetermined with respect to the point 'k' which is the target point of the T-character outline route (FIG. 13A), the target point is switched from the point 'k' to the point 'm' before displaying new outline route (FIG. 13B).

Subsequently, the operator advances the wiring operation while referring to the newly displayed outline route shown in FIG. 13B, the outline route navigate ratsnest A for connecting the target point extracted from outline route with the pointed end position of the operation, and the ratsnest B for connecting to the pointed end position of the operation.

Furthermore, in the cases where there is determined by (1) IMPOSSIBLE, as shown in FIG. 12, the outline route connecting directly the start place with the target 2 is displayed. The operator advances the wiring operation while referring to the displayed outline route, the outline route navigate ratsnest A for connecting the target point calculated from the outline route with the pointed end position of the operation, and the ratsnest B for connecting to the pointed end position of the operation.

Figure 14A:
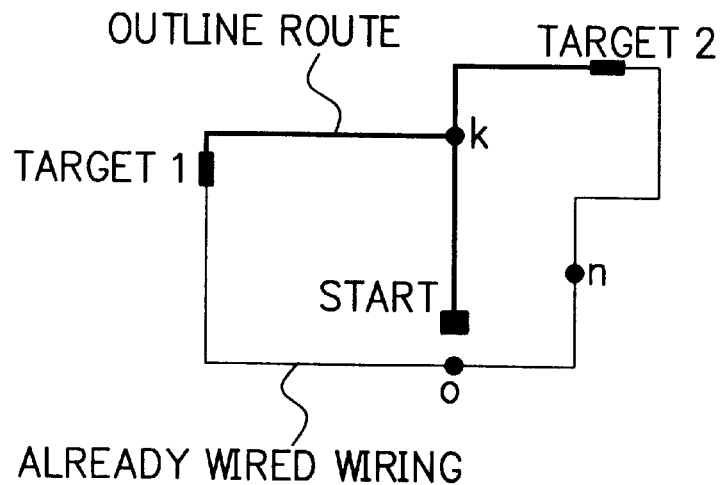
FIGS. 14A, 14B, 14C are views showing a third example of the outline route displayed when it causes T-wiring to be executed in another embodiment of the present invention.

Moreover, the already wired wiring is wired such that the start place is surrounded as shown in FIG. 14A. Simultaneously, the T-character wiring is determined by (2) POSSIBLE BY VIA. In such the case, as shown in FIG. 14A, the connection is capable of being performed only at the position of the via (through hole; here point 'n') existing on the already wired wiring for connecting the target 1 with the target 2. On this occasion, the point 'n' does not exist within the fixed distance predetermined with respect to the target point (point 'k') on the T-character outline route. Therefore, the T-character outline route displayed is eliminated before displaying new outline route.

Figure 14B:
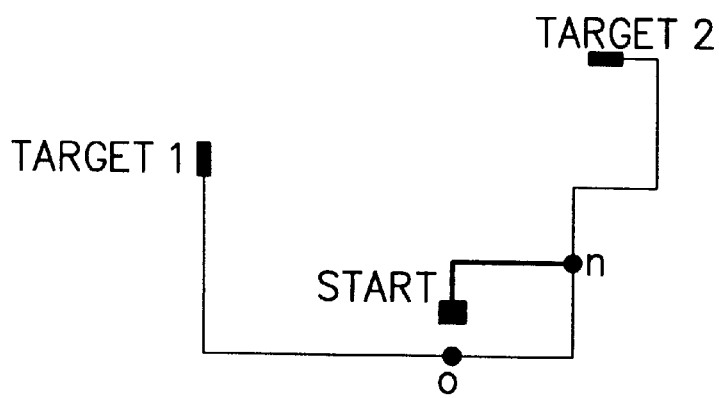

Subsequently, the operator advances the wiring operation while referring to the newly displayed outline route shown in FIG. 14B, the outline route navigate ratsnest A for connecting the target point extracted from outline route with the pointed end position of the operation, and the ratsnest B for connecting the operation point to the target 2.

Further, in the case where there is judged that the T-character wiring is (3) POSSIBLE in any position, it is capable of being performed a connecting from the start place where is any position on the already wired wiring connecting the target 1 with the target 2. However, the target point (point 'k') on the T-character outline route does not exist within fixed distance predetermined beforehand with respect to the already wired wiring connecting the target 1 with the target 2. The operator eliminates the T-character outline route displayed until now. Here, the display screen displays new outline route connecting the start place with the most nearest place (point 'o') by a straight line.

Subsequently, the operator advances the wiring operation while referring to the newly displayed outline route shown in FIG. 14B, the outline route navigate ratsnest A for connecting the target point extracted from outline route with the pointed end position of the operation, and the ratsnest B for connecting the operation point to the target 2.

Furthermore, in the case where there is judged that the T-character wiring is (3) IMPOSSIBLE, the display screen is changed. Here the display screen displays the outline route for connecting directly the target 2 and the start place. Subsequently, the operator advances the wiring operation while referring to outline route displayed here, the outline route navigate ratsnest A for connecting the target point calculated from outline route with the position of the operation, and the ratsnest B for connecting the operation point with the target 2.

Figure 15A:
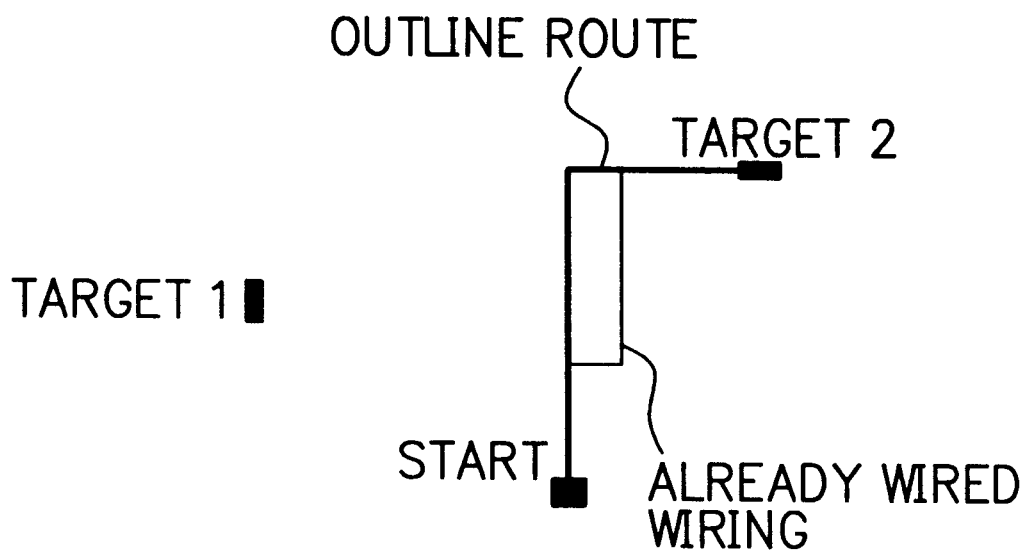
FIGS. 15A, 15B are views showing a fourth example of the outline route displayed when it causes T-wiring to be executed in another embodiment of the present invention.

On the other hand, the outline route connecting the start place with the target 2 is displayed as shown in FIG. 15A in the case where the specified target place (target 2) and the another target place (target 1) are not wired yet. The operator advances the wiring operation while referring to outline route displayed here, the outline route navigate ratsnest A for connecting the target point extracted from such the outline route with the position of the operation, and the ratsnest B for connecting the operation point with the target 2 that is the same way as the described embodiment.

Next, it causes the T-character wiring to be performed from the target 1 with respect to the already wired wiring between the target 2 and the start place. In the case where the T-character wiring is (1) IMPOSSIBLE with respect to the already wired wiring between the start place and the target 2, the displayed screen is changed. The display screen displays the outline route connecting directly the target 2 or the start place (here, target 2) with the target 1. Subsequently, the operator advances the wiring operation while referring to the outline route displayed here, the outline route navigate ratsnest A connecting the target point calculated from such the outline route with the operation point, and the ratsnest B connecting the operation point with the target 2.

Figure 15B:
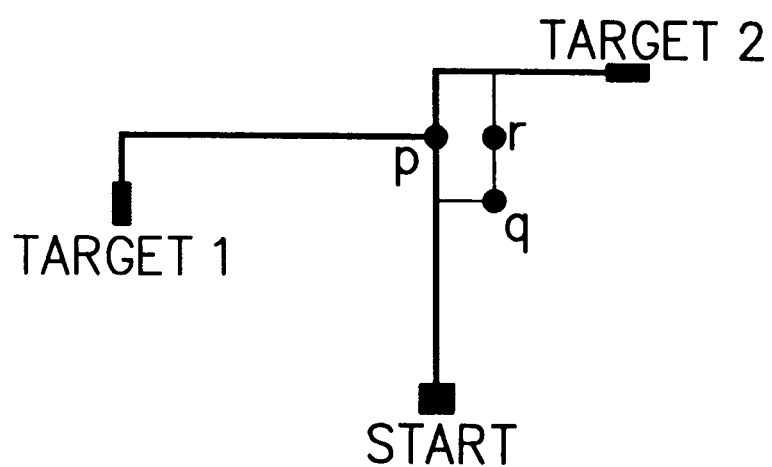

Furthermore, in the case where it is judged that the T-character wiring is anywhere (3) POSSIBLE with respect to the already wired wiring between the target 2 and the start place. The display screen displays the new outline route while switching the target point from the target point (point 'p') on the T-character outline route displayed on the display screen as shown in FIG. 15B into the place (point 'r') existing in the nearest position, on the already wired wiring connecting the target 2 with the start place.

Subsequently, the operator advances the wiring operation while referring to the outline route displayed newly, the outline route navigate ratsnest connecting the target point (point 'q') calculated from this outline route with the operation point, and the ratsnest B connecting the operation point with the target 2.

Furthermore, in the case where it is judged that the T-character wiring is anywhere (3) POSSIBLE with respect to the already wired wiring between the target 2 and the start place. The display screen displays the new outline route while switching the target point from the target point (point 'p') on the T-character outline route displayed on the display screen as shown in FIG. 16B into the place (point 'r') existing in the nearest position, on the already wired wiring connecting the target 2 with the start place.

Subsequently, the operator advances the wiring operation while referring to the outline route displayed newly on the display screen similarly, the outline route navigate ratsnest A connecting the target point (point 'h') calculated from this outline route, and the ratsnest B connecting the operation point and the target 2.

There will be described flow of operation for determining the outline route in the T-character wiring described above on the basis of flowchart shown in FIG. 16.

Firstly, it causes the position of the target point calculated to be read from the outline route displayed on the display screen (STEP S31). Next, it causes position to be calculated in that such position has possibility of becoming the target point on the already wired wiring (hereinafter referred to as candidate of target point) (STEP S32). Here the candidate of target point calculated from the already wired wiring depends on judgement result about the T-character wiring. In this case, when the candidate of target point is judged as (2) POSSIBLE BY VIA, it causes position of the another via existing on the already wired wiring to be calculated as the candidate of target point on the already wired wiring. While when the candidate of target point is judged as (3) POSSIBLE in anywhere, it causes the place positioned in the most nearest place from the position of the target point calculated from the outline route to be calculated as the candidate of target point on the already wired wiring.

With respect to the candidate of target point on the already wired wiring calculated in such the way, judgement is implemented whether or not the candidate of target point is positioned within the fixed distance from the target point on the outline route (STEP S33). Here, when the candidate of target point on the already wired wiring is judged that the candidate of target point positions within the fixed distance from the target point on the outline route (STEP S33/YES), namely, when the already wired wiring as shown in FIG. 12A exists, the display screen displays new outline route while switching the target point from the position on the outline route into the position of the candidate of target point on the already wired wiring. Thus, the operator advances the wiring operation while referring to the outline route newly displayed on the display screen, the outline route navigate ratsnest A connecting the target point calculated from the outline route, and the ratsnest B connecting the operation point with the target 2 (STEP S34).

Figure 14C:
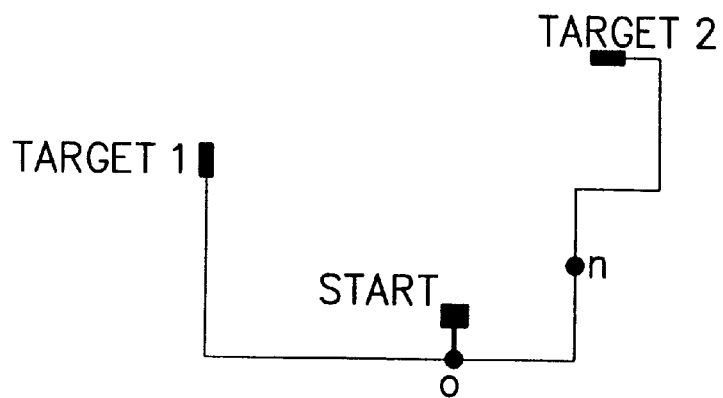

In the judgement of STEP S33, when it is judged that the candidate of target point in the already wired wiring does not position within the fixed distance from the target point on the outline route (STEP S33/NO), namely, when the already wired wiring as shown in FIG. 14, exists, the output unit 6 displays new outline route having the target point so as to exist within the prescribed distance set beforehand, from among the candidate of target points on the already wired wiring according to the target point calculator 4. The operator advances the wiring operation while referring to the outline route newly displayed on the display screen, the outline route navigate ratsnest A connecting the target point calculated from this outline route with the pointed end position of the operation route, and the ratsnest B connecting the pointed end position of the operation route (STEP S35).

Here, there will be described the newly displayed outline route in STEEP S35. The newly displayed outline route depends on the T-character wiring judgement result with respect to the already wired wiring. When it is judged that the T-character wiring is capable of being performed by (2) POSSIBLE BY VIA, the display screen displays the outline route so that the connection is implemented at the position of the via on the already wired wiring. When it is judged that the T-character wiring is capable of being performed by (3) POSSIBLE anywhere, the display screen displays the outline route. In such the outline route, connection position to the start place is near the start position on the already wired wiring and it is capable of being wired while avoiding the area in which wiring is congested.

Further, in the case where the T-character wiring is capable of being performed by (2) POSSIBLA BY VIA, and when a plurality of vias (through holes) exist on the already wired wiring, before selecting one via from among the plurality of vias (through holes), thus the display screen displays the outline route. Such the outline route is capable of being wired while avoiding the area in which wiring is congested. In such the outline route, the wiring is capable of being performed by short route and so forth. Thus, efficient wiring is performed.

Furthermore, when the T-character wiring to the already wired wiring is (1) IMPOOSIBLE, the target point on the already wired wiring becomes the target 2 in spite of judgement whether, in STEP S33, the candidate of target point on the already wired wiring exists within from the target point on the outline route. Thus the display screen displays the outline route connecting directly the start place or the target 1 with the target 2.

As described in the another embodiment, there is described the case where it causes the wiring to be implemented toward the two target places as one example. The present invention is capable of being applied to the wiring toward the more target places due to repetition of the above described operation.

In the above described embodiment, the target point calculator 5 calculates one target point, before displaying one outline route navigate ratsnest B connecting the operation point with the target point. However, when it causes a plurality of singularity points to be calculated by the singularity point position calculator 4, the target point calculator 5 calculates a plurality of target points from among the plurality of the singularity points, it is capable of displaying a plurality of outline route navigate ratsnests B capable of discriminating visually. For instance, it is suitable that a plurality of the outline route navigate ratsnests are colored respectively.

Further, in the present invention, if the route inputted beforehand is the route with the coordinates value information, it is capable of calculating the singularity point even though the route is not the large area wiring route. According to the same processing described above, it is capable of displaying the ratsnest indicating deviation direction from the inputted route.

Furthermore, in the present invention, if the route inputted beforehand is the route with the coordinates value information, it is capable of calculating the singularity point. It is capable of displaying the ratsnest indicating deviation direction from the inputted route. Therefore, it is capable of applying the present invention as the navigation system in order to guide the route for the user while displaying the ratsnest more than one for indicating deviation direction of the present place from the ideal route with the ideal route toward the position to be the object displayed.

As is clear from the explanation described-above, according to the present invention, when it causes wiring operation of the printed substrate to be executed, it is capable of displaying the ratsnest which is recognized appropriately by the operator concerning the direction for progressing wiring operation without including both of start point and end point within the screen displayed.

The reason why it is capable of displaying the ratsnest changing dynamically on the way of wiring in that the deviation direction from the recommended outline route can be recognized visually on the display screen on the way of practical wiring operation.

Further, the display method of the ratsnest in the present invention is not restricted by only application of wiring operation of the printed substrate, but it is capable of applying the environment represented by navigation system for guiding the route toward the object for the user.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

What is claimed is:

1. A route determination support device comprising:
   an input unit for inputting information for determining the route;
   a singularity point position calculator for searching position of a singularity point with direction switching property of said route;
   a singularity point storage unit for storing therein data of said singularity point calculated by said singularity point position calculator;
   a target point calculator for selecting a point with the shortest distance from among calculated distances as a target point while calculating distance between the position of said singularity point stored in said singularity point storage unit and a present position utilizing priority of wiring order determined beforehand; and
   an output unit for displaying ratsnest concerning progress and/or result of route determination operation.

2. A route determination support device as claimed in claim 1, wherein target point calculator extracts at least one target point whose angle between newly progressing direction of said outline route and original progressing direction of said route is more than certain threshold value as said singularity point from outline route displayed on a screen of said output unit.

3. A route determination support device as claimed in claim 1, wherein target point calculator selects a point at which progressing direction of said outline route changes into vertical direction with respect to plane of wiring route as said singularity point.

4. A route determination support device as claimed in claim 1, wherein said target point calculator extracts said target point from among the singularity points on the basis of result of multiplying coefficients in accordance with given order to respective singularity points from start point side of said outline route by distance between the present point and respective singularity points in every singularity point.

5. A route determination support device as claimed in claim 4, wherein said coefficients are coefficients which increase in accordance with the given order of the respective singularity points.

6. A route determination support device as claimed in claim 5, wherein said target point calculator extracts one and/or a plurality of target points from the singularity points with small value from among the results obtained by multiplying said coefficients by distance between said present point and respective singularity points in every singularity point.

7. A route determination support device as claimed in claim 6, wherein said given order of the respective singularity points is updated in such a way that in every time when said present point approaches within prescribed distance from said target point, it causes the singularity point positioned at the side of end point of said outline route by one to be starting point.

8. A route determination support device as claimed in claim 1, further comprising:
   a passing through point acquisition means for acquiring the passing through point of the outline route displayed on a screen to be ideal route;
   a singularity point calculation means for calculating at least one singularity point on the basis of prescribed condition from among the acquired passing through points;

a distance calculation means for calculating distance between said calculated singularity points and the present point whose position is movable on said screen;

a multiplying means for multiplying coefficients in accordance with order which is given to respective singularity points from the starting point side of said outline route on said outline route by the distance calculated by said distance calculation means;

a target point established means for calculating at least one target point from among said singularity point on the basis of the result of said multiplication; and a display means for displaying a straight line for connecting at 20 least one target point established previously with said present point.

9. A route determination support device as claimed in claim 1, further comprising:

a passing through point acquisition means for acquiring the passing through point on matrix-shaped frame dividing the whole printed wiring substrate according to displayed outline route on the screen to be ideal route;

a singularity point calculation means for calculating at least one singularity point on the basis of prescribed condition from among the acquired passing through points;

a distance calculation means for calculating distance between said calculated singularity point and an operation point to be a pointed end place of a wiring operation;

a multiplying means for multiplying coefficients in accordance with order which is given to respective singularity points from the starting point side of said outline route on said outline route by the distance calculated by said distance calculation means;

a target point established means for calculating at least one target point from among said singularity point on the basis of the result of said multiplication; and a display means for displaying a straight line for connecting at least one target point established previously with said present point.

10. A route determination support device as claimed in claim 8, wherein singularity point calculation means extracts at least one target point whose angle between newly progressing direction of said route and original progressing direction of said route is more than certain threshold value as said singularity point from outline route displayed on a screen of said output unit.

11. A route determination support device as claimed in claim 8, wherein singularity point calculation means selects a point at which progressing direction of said outline route changes into vertical direction with respect to plane of wiring route as said singularity point.

12. A route determination support device as claimed in claim 8, wherein said target point calculation means extracts said target point from among the singularity points on the basis of result of multiplying coefficients in accordance with given order to respective singularity points from start point side of said outline route by distance between the present point and respective singularity points in every singularity point.

13. A route determination support device as claimed in claim 12, wherein said coefficients are coefficients which increase in accordance with the given order of the respective singularity points.

14. A route determination support device as claimed in claim 13, wherein said singularity point calculation means extracts one and/or a plurality of target points from the singularity points with small value from among the results obtained by multiplying said coefficients by distance between said present point and respective singularity points in every singularity point.

15. A route determination support device as claimed in claim 14, wherein said given order of the respective singularity points is updated in such a way that in every time when said present point approaches within prescribed distance from said target point, it causes the singularity point positioned at the side of end point of said outline route by one to be starting point.

16. A route determination support device as claimed in claim 9, wherein said singularity point calculation means causes the position in which wiring for changing layer through a via (through hole) on said outline route to be a singularity point.

17. A route determination support device as claimed in claim 9, wherein one passing through point is taken to be "current", and a passing through point positioned at said starting point side by one with respect to said passing through point to be the "current" on said outline route is taken to be "prev", further a passing through point positioned at said end point side by one with respect to said passing through point to be the "current" on said outline route is taken to be "next", and wherein there is further provided a first judgement means for judging whether or not angle between original direction of route connecting said "prev" with said "current" and new direction of route connecting said "current" with said "next" is more than said prescribed value, wherein when said first judgement means judges that said angle between original direction of route connecting said "prev" with said "current" and new direction of route connecting said "current" with said "next" is more than said prescribed value, said singularity point calculation means calculates said "current" as the singularity point.

18. A route determination support device as claimed in claim 17, further comprising a second judgement means for judging whether or not a layer in which said "current" exists and a layer in which said "next" are the same layers, wherein when said second judgement means judges that the layer in which the "current" exists differs from the layer in which the "next" exists, said singularity calculation means calculates the singularity point on the route connecting said "current" with said "next".

19. A route determination support device as claimed in claim 18, further comprising:

a third judgement means for judging whether or not a first end point and a second end point are already wired when a plurality of end points of the wiring operation exist on the printed wiring substrate;

a fourth judgement means, when said third judgement means judges that the already wired wiring exists, for judging whether or not a T-character wiring from said starting point is performed at position which said via (through hole) on said already wired wiring with respect to said already wired wiring, and/or is performed in any position on said already wired wiring; and a fifth judgement means, when said fourth judgement means judges that the T-character wiring is possible in the position where the via (through hole) on said already wired wiring exists, for judging whether or not the target point calculated by said target point calculation means from the T-character outline route displayed on the screen to be ideal route exists within prescribed distance determined beforehand from the position of said via (through hole), wherein when said fifth judgement means judges that said target 20 point exists within said prescribed distance from the position of said via, said display means displays new outline route for executing connection at position of said via.

20. A route determination support device as claimed in claim 19, wherein when said fifth judgement means judges that said target point does not exist within said prescribed distance from the position of said via, said display means displays new outline route having a target point existing within said prescribed distance from the position of another via on said already wired wiring.

21. A route determination support device as claimed in claim 20, further comprising a sixth judgement means for judging whether or not said target point calculated from said T-character outline route by said target point calculation means exists within said prescribed distance from a spot positioned in the most nearest place to said starting point on said already wired wiring when said fourth judgement means judges that the T-character wiring is performed in any position on said already wired wiring, wherein when said sixth judgement means judges that said target point exists within said prescribed distance from said spot, said display means displays new outline route for the sake of connection at said spot.

22. A route determination support device as claimed in claim 21, wherein when said sixth judgement means judges that said target point does not exist within said prescribed distance from said spot, said display means displays new outline wiring which has a target point existing within said prescribed distance from said already wired wiring.

23. A storage medium storing therein a program for executing processing of:

a processing for inputting information for determining the route by a input means;

a processing for searching position of a singularity point with direction switching property of said route by a singularity point position calculator;

a processing for storing therein data of said singularity point calculated by said singularity point position calculator by a singularity point storage unit;

a processing for selecting a point with the shortest distance from among calculated distances as a target point while calculating distance between the position of said singularity point stored in said singularity point storage unit and a present position utilizing priority of wiring order determined beforehand a target point calculator; and a processing for displaying ratsnest concerning progress and/or result of route determination operation by an output unit.

24. A storage medium storing therein a program for executing processing as claimed in claim 23, wherein there is provided processing of extracting at least one target point whose angle between newly progressing direction of said route and original progressing direction of said route is more than certain threshold value as said singularity point from outline route displayed on a screen of said output unit by means of target point calculator.

25. A storage medium storing therein a program for executing processing as claimed in claim 23, wherein there is provided processing of selecting a point at which pro-gressing direction of said outline route changes into vertical direction with respect to plane of wiring route as said singularity point by means of target point calculator.

26. A storage medium storing therein a program for executing processing as claimed in claim 23, wherein there is provided processing of extracting said target point from among the singularity points on the basis of result of multiplying coefficients in accordance with given order to respective singularity points from start point side of said outline route by distance between the present point and respective singularity points in every singularity point by means of said target point calculator.

27. A storage medium storing therein a program for executing processing as claimed in claim 26, wherein said coefficients are coefficients which increase in accordance with a given order of the respective singularity points.

28. A storage medium storing therein a program for executing processing as claimed in claim 27, wherein there is provided processing of extracting one and/or a plurality of target points from the singularity points with small value from among the results obtained by multiplying said coefficients by distance between said present point and respective singularity points in every singularity point by means of said target point calculator.

29. A storage medium storing therein a program for executing processing as claimed in claim 28, wherein said given order of the respective singularity points is updated in such a way that in every time when said present point approaches within prescribed distance from said target point, it causes the singularity point positioned at the side of end point of said outline route by one to be starting point.

30. A storage medium storing therein a program for executing processing as claimed in claim 23, further comprising the processing of:

a processing for acquiring the passing through point of the outline route displayed on a screen to be ideal route by means of a passing through point acquisition means;

a processing for calculating at least one singularity point on the basis of prescribed condition from among the acquired passing through points by means of a singularity point calculation means;

a processing for calculating distance between said calculated singularity points and the present point whose position is movable on said screen by means of a distance calculation means;

a processing for multiplying coefficients in accordance with order which is given to respective singularity points from the starting point side of said outline route on said outline route by the distance calculated by said distance calculation means;

a processing for calculating at least one target point from among said singularity point on the basis of the result of said multiplication by means of a target point established means; and a processing for displaying a straight line for connecting at least 20 one target point established previously with said present point by means of a display means.

31. A storage medium storing therein a program for executing processing as claimed in claim 23, further comprising the processing of:

a processing for acquiring the passing through point on matrix-shaped frame dividing the whole printed wiring substrate according to displayed outline route on the screen to be ideal route by means of a passing through point acquisition means;

a processing for calculating at least one singularity point on the basis of prescribed condition from among the acquired passing through points by means of a singularity point calculation means; a processing for calculating distance between said calculated singularity point and an operation point to be a pointed end place of a wiring operation by means of a distance calculation means;

a processing for multiplying coefficients in accordance with order which is given to respective singularity points from the starting point side of said outline route on said outline route by the distance calculated by said distance calculation means;

a processing for calculating at least one target point from among said singularity point on the basis of the result of said multiplication by means of a target point established means; and a processing for displaying a straight line for connecting at least one target point established previously with said present point by means of a display means.

32. A storage medium storing therein a program for executing processing as claimed in claim 30, further comprising the processing of: extracting at least one target point whose angle between newly progressing direction of said route and original progressing direction of said route is more than certain threshold value as said singularity point from outline route displayed on a screen of said output unit by means of singularity point calculation means.

33. A storage medium storing therein a program for executing processing as claimed in claim 30, further comprising the processing of: selecting a point at which progressing direction of said outline route changes into vertical direction with respect to plane of wiring route as said singularity point by means of said singularity point calculation means.

34. A storage medium storing therein a program for executing processing as claimed in claim 30, further comprising the processing of:

extracting said target point from among the singularity points on the basis of result of multiplying coefficients in accordance with given order to respective singularity points from start point side of said outline route by distance between the present point and respective singularity points in every singularity point by means of said target point calculation means.

35. A storage medium storing therein a program for executing processing as claimed in claim 34, wherein said coefficients are coefficients which increase in accordance with the given order of the respective singularity points.

36. A storage medium storing therein a program for executing processing as claimed in claim 30, further comprising the processing of:

extracting one and/or a plurality of target points from the singularity points with small value from among the results obtained by multiplying said coefficients by distance between said present point and respective singularity points in every singularity point by means of said singularity point calculation means.

37. A storage medium storing therein a program for executing processing as claimed in claim 36, wherein said given order of the respective singularity points is updated in such a way that in every time when said present point approaches within prescribed distance from said target point, it causes the singularity point positioned at the side of end point of said outline route by one to be starting point.

38. A storage medium storing therein a program for executing processing as claimed in claim 30, further comprising the processing of:

causing the position in which wiring for changing layer through a via (through hole) on said outline route to be a singularity point by means of said singularity point calculation means.

39. A storage medium storing therein a program for executing processing as claimed in claim 30, wherein one passing through point is taken to be "current", and a passing through point positioned at said starting point side by one with respect to said passing through point to be the "current" on said outline route is taken to be "prev", further a passing through point positioned at said end point side by one with respect to said passing through point to be the "current" on said outline route is taken to be "next", and wherein there is further provided a first judgement means for judging whether or not angle between original direction of route connecting said "prev" with said "current" and new direction of route connecting said "current" with said "next" is more than said prescribed value, wherein when said first judgement means judges that said angle between original direction of route connecting said "prev" with said "current" and new direction of route connecting said "current" with said "next" is more than said prescribed value, said singularity point calculation means calculates said "current" as the singularity point.

40. A storage medium storing therein a program for executing processing as claimed in claim 39, further comprising the processing of: a processing for judging whether or not a layer in which said "current" exists and a layer in which said "next" are the same layers by means of a second judgement means, wherein when said second judgement means judges that the layer in which the "current" exists differs from the layer in which the "next" exists, said singularity calculation means calculates the singularity point on the route connecting said "current" with said "next".

41. A storage medium storing therein a program for executing processing as claimed in claim 40, further comprising the processing of:

a processing for judging whether or not a first end point and a second end point are already wired when a plurality of end points of the wiring operation exist on the printed wiring substrate by means of a third judgement means;

a processing for judging whether or not a T-character wiring from said starting point is performed at position which said via (through hole) on said already wired wiring with respect to said already wired wiring, and/or is performed in any position on said already wired wiring by means of a fourth judgement means, when said third judgement means judges that the already wired wiring exists; and a processing for judging whether or not the target point calculated by said target point calculation means from the T-character outline route displayed on the screen to be ideal route exists within prescribed distance determined beforehand from the position of said via (through hole) by means of a fifth judgement means, when said fourth judgement means judges that the T-character wiring is possible in the position where the via (through hole) on said already wired wiring exists, wherein when said fifth judgement means judges that said target point exists within said prescribed distance from the position of said via, said display means displays new outline route for executing connection at position of said via.

42. A storage medium storing therein a program for executing processing as claimed in claim 41, wherein when said fifth judgement means judges that said target point does not exist within said prescribed distance from the position of said via, said display means displays new outline route having a target point existing within said prescribed distance from the position of another via on said already wired wiring.

43. A storage medium storing therein a program for executing processing as claimed in claim 40, further comprising the processing of: a processing for judging whether or not said target point calculated from said T-character outline route by said target point calculation means exists within said prescribed distance from a spot positioned in the most nearest place to said starting point on said already wired wiring when said fourth judgement means judges that the T-character wiring is performed in any position on said already wired wiring by means of a sixth judgement means, wherein when said sixth judgement means judges that said target point exists within said prescribed distance from said spot, said display means displays new outline route for the sake of connection at said spot.

44. A storage medium storing therein a program for executing processing as claimed in claim 43, further comprising the processing of a processing for judging that said target point does not exist within said prescribed distance from said spot, said display means displays new outline wiring which has a target point existing within said prescribed distance from said already wired wiring.

45. A printed substrate wiring method comprising the steps of:

a step for inputting information for determining the route by a input means;

a step for searching position of a singularity point with direction switching property of said route by a singularity point position calculator;

a step for storing therein data of said singularity point calculated by said singularity point position calculator by a singularity point storage unit;

a step for selecting a point with the shortest distance from among calculated distances as a target point while calculating distance between the position of said singularity point stored in said singularity point storage unit and a present position utilizing priority of wiring order determined beforehand a target point calculator; and a step for displaying ratsnest concerning progress and/or result of route determination operation by an output unit.

46. A printed substrate wiring method as claimed in claim 45, further comprising the step of extracting at least one target point whose angle between newly progressing direction of said route and original progressing direction of said route is more than certain threshold value as said singularity point from outline route displayed on a screen of said output unit by means of target point calculator.

47. A printed substrate wiring method as claimed in claim 45, further comprising the step of selecting a point at which progressing direction of said outline route changes into vertical direction with respect to plane of wiring route as said singularity point by means of target point calculator.

48. A printed substrate wiring method as claimed in claim 45, further comprising the step of extracting said target point from among the singularity points on the basis of result of multiplying coefficients in accordance with given order to respective singularity points from start point side of said outline route by distance between the present point and respective singularity points in every singularity point by means of said target point calculator.

49. A printed substrate wiring method as claimed in claim 48, wherein said coefficients are coefficients which increase in accordance with the given order of the respective singularity points.

50. A printed substrate wiring method as claimed in claim 49, further comprising the step of extracting one and/or a plurality of target points from the singularity points with small value from among the results obtained by multiplying said coefficients by distance between said present point and respective singularity points in every singularity point by means of said target point calculator.

* * * * *